(12) United States Patent
Okhonin et al.

(10) Patent No.: US 8,325,515 B2
(45) Date of Patent: Dec. 4, 2012

(54) INTEGRATED CIRCUIT DEVICE

(75) Inventors: Serguei Okhonin, Lausanne (CH);
Mikhail Nagoga, Lausanne (CH)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/225,318

(22) Filed: Sep. 2, 2011

(65) Prior Publication Data

US 2012/0002467 A1    Jan. 5, 2012

Related U.S. Application Data

(63) Continuation of application No. 12/367,154, filed on Feb. 6, 2009, now Pat. No. 8,014,195.

(60) Provisional application No. 61/026,705, filed on Feb. 6, 2008.

(51) Int. Cl.
*G11C 11/34* (2006.01)

(52) U.S. Cl. ........ 365/177; 365/222; 365/190; 365/149; 365/230.03

(58) Field of Classification Search .................. 365/177, 365/222, 190, 149, 230.03
See application file for complete search history.

(56) References Cited

U.S. PATENT DOCUMENTS

| | | | |
|---|---|---|---|
| 3,439,214 A | 4/1969 | Kabell |
| 3,997,799 A | 12/1976 | Baker |
| 4,032,947 A | 6/1977 | Kesel et al. |
| 4,250,569 A | 2/1981 | Sasaki et al. |
| 4,262,340 A | 4/1981 | Sasaki et al. |
| 4,298,962 A | 11/1981 | Hamano et al. |
| 4,371,955 A | 2/1983 | Sasaki |
| 4,527,181 A | 7/1985 | Sasaki |
| 4,630,089 A | 12/1986 | Sasaki et al. |
| 4,658,377 A | 4/1987 | McElroy |
| 4,791,610 A | 12/1988 | Takemae |
| 4,807,195 A | 2/1989 | Busch et al. |
| 4,954,989 A | 9/1990 | Auberton-Herve et al. |
| 4,979,014 A | 12/1990 | Hieda et al. |
| 5,010,524 A | 4/1991 | Fifield et al. |
| 5,144,390 A | 9/1992 | Matloubian |
| 5,164,805 A | 11/1992 | Lee |
| 5,243,554 A | 9/1993 | Allen et al. |
| 5,258,635 A | 11/1993 | Nitayama et al. |
| 5,313,432 A | 5/1994 | Lin et al. |
| 5,315,541 A | 5/1994 | Harari et al. |

(Continued)

FOREIGN PATENT DOCUMENTS

CA        272437        7/1927

(Continued)

OTHER PUBLICATIONS

Arimoto et al., A Configurable Enhanced T2RAM Macro for System-Level Power Management Unified Memory, 2006, VLSI Symposium.

(Continued)

*Primary Examiner* — Connie Yoha
(74) *Attorney, Agent, or Firm* — Wilmer Cutler Pickering Hale and Dorr LLP

(57) ABSTRACT

A semiconductor device along with circuits including same and methods of operating same are disclosed. In one particular embodiment, the device may comprise a memory cell including a transistor. The transistor may comprise a gate, an electrically floating body region, and a source region and a drain region adjacent the body region. Data stored in memory cells of the device may be refreshed during hold operations.

20 Claims, 15 Drawing Sheets

U.S. PATENT DOCUMENTS

| | | | |
|---|---|---|---|
| 5,350,938 | A | 9/1994 | Matsukawa |
| 5,355,330 | A | 10/1994 | Hisamoto et al. |
| 5,388,068 | A | 2/1995 | Ghoshal et al. |
| 5,397,726 | A | 3/1995 | Bergemont et al. |
| 5,432,730 | A | 7/1995 | Shubat et al. |
| 5,446,299 | A | 8/1995 | Acovic et al. |
| 5,448,513 | A | 9/1995 | Hu et al. |
| 5,466,625 | A | 11/1995 | Hsieh et al. |
| 5,489,792 | A | 2/1996 | Hu et al. |
| 5,506,436 | A | 4/1996 | Hayashi et al. |
| 5,515,383 | A | 5/1996 | Katoozi |
| 5,526,307 | A | 6/1996 | Yiu et al. |
| 5,528,062 | A | 6/1996 | Hsieh et al. |
| 5,568,356 | A | 10/1996 | Schwartz |
| 5,583,808 | A | 12/1996 | Brahmbhatt |
| 5,593,912 | A | 1/1997 | Rajeevakumar |
| 5,606,188 | A | 2/1997 | Bronner et al. |
| 5,608,250 | A | 3/1997 | Kalnitsky |
| 5,627,092 | A | 5/1997 | Alsmeier et al. |
| 5,631,186 | A | 5/1997 | Park et al. |
| 5,677,867 | A | 10/1997 | Hazani |
| 5,696,718 | A | 12/1997 | Hartmann |
| 5,740,099 | A | 4/1998 | Tanigawa |
| 5,754,469 | A | 5/1998 | Hung et al. |
| 5,774,411 | A | 6/1998 | Hsieh et al. |
| 5,778,243 | A | 7/1998 | Aipperspach et al. |
| 5,780,906 | A | 7/1998 | Wu et al. |
| 5,784,311 | A | 7/1998 | Assaderaghi et al. |
| 5,798,968 | A | 8/1998 | Lee et al. |
| 5,798,976 | A | 8/1998 | Arimoto |
| 5,811,283 | A | 9/1998 | Sun |
| 5,847,411 | A | 12/1998 | Morii |
| 5,877,978 | A | 3/1999 | Morishita et al. |
| 5,886,376 | A | 3/1999 | Acovic et al. |
| 5,886,385 | A | 3/1999 | Arisumi et al. |
| 5,897,351 | A | 4/1999 | Forbes |
| 5,929,479 | A | 7/1999 | Oyama |
| 5,930,648 | A | 7/1999 | Yang |
| 5,936,265 | A | 8/1999 | Koga |
| 5,939,745 | A | 8/1999 | Park et al. |
| 5,943,258 | A | 8/1999 | Houston et al. |
| 5,943,581 | A | 8/1999 | Lu et al. |
| 5,960,265 | A | 9/1999 | Acovic et al. |
| 5,968,840 | A | 10/1999 | Park et al. |
| 5,977,578 | A | 11/1999 | Tang |
| 5,982,003 | A | 11/1999 | Hu et al. |
| 5,986,914 | A | 11/1999 | McClure |
| 6,018,172 | A | 1/2000 | Hidaka et al. |
| 6,048,756 | A | 4/2000 | Lee et al. |
| 6,081,443 | A | 6/2000 | Morishita |
| 6,096,598 | A | 8/2000 | Furukawa et al. |
| 6,097,056 | A | 8/2000 | Hsu et al. |
| 6,097,624 | A | 8/2000 | Chung et al. |
| 6,111,778 | A | 8/2000 | MacDonald et al. |
| 6,121,077 | A | 9/2000 | Hu et al. |
| 6,133,597 | A | 10/2000 | Li et al. |
| 6,157,216 | A | 12/2000 | Lattimore et al. |
| 6,171,923 | B1 | 1/2001 | Chi et al. |
| 6,177,300 | B1 | 1/2001 | Houston et al. |
| 6,177,698 | B1 | 1/2001 | Gruening et al. |
| 6,177,708 | B1 | 1/2001 | Kuang et al. |
| 6,214,694 | B1 | 4/2001 | Leobandung et al. |
| 6,222,217 | B1 | 4/2001 | Kunikiyo |
| 6,225,158 | B1 | 5/2001 | Furukawa et al. |
| 6,245,613 | B1 | 6/2001 | Hsu et al. |
| 6,252,281 | B1 | 6/2001 | Yamamoto et al. |
| 6,262,935 | B1 | 7/2001 | Parris et al. |
| 6,292,424 | B1 | 9/2001 | Ohsawa |
| 6,297,090 | B1 | 10/2001 | Kim |
| 6,300,649 | B1 | 10/2001 | Hu et al. |
| 6,320,227 | B1 | 11/2001 | Lee et al. |
| 6,333,532 | B1 | 12/2001 | Davari et al. |
| 6,333,866 | B1 | 12/2001 | Ogata |
| 6,350,653 | B1 | 2/2002 | Adkisson et al. |
| 6,351,426 | B1 | 2/2002 | Ohsawa |
| 6,359,802 | B1 | 3/2002 | Lu et al. |
| 6,384,445 | B1 | 5/2002 | Hidaka et al. |
| 6,391,658 | B1 | 5/2002 | Gates et al. |
| 6,403,435 | B1 | 6/2002 | Kang et al. |
| 6,421,269 | B1 | 7/2002 | Somasekhar et al. |
| 6,424,011 | B1 | 7/2002 | Assaderaghi et al. |
| 6,424,016 | B1 | 7/2002 | Houston |
| 6,429,477 | B1 | 8/2002 | Mandelman et al. |
| 6,432,769 | B1 | 8/2002 | Fukuda et al. |
| 6,440,872 | B1 | 8/2002 | Mandelman et al. |
| 6,441,435 | B1 | 8/2002 | Chan |
| 6,441,436 | B1 | 8/2002 | Wu et al. |
| 6,466,511 | B2 | 10/2002 | Fujita et al. |
| 6,479,862 | B1 | 11/2002 | King et al. |
| 6,480,407 | B1 | 11/2002 | Keeth |
| 6,492,211 | B1 | 12/2002 | Divakaruni et al. |
| 6,518,105 | B1 | 2/2003 | Yang et al. |
| 6,531,754 | B1 | 3/2003 | Nagano et al. |
| 6,537,871 | B2 | 3/2003 | Forbes |
| 6,538,916 | B2 | 3/2003 | Ohsawa |
| 6,544,837 | B1 | 4/2003 | Divakauni et al. |
| 6,548,848 | B2 | 4/2003 | Horiguchi et al. |
| 6,549,450 | B1 | 4/2003 | Hsu et al. |
| 6,552,398 | B2 | 4/2003 | Hsu et al. |
| 6,552,932 | B1 | 4/2003 | Cernea |
| 6,556,477 | B2 | 4/2003 | Hsu et al. |
| 6,560,142 | B1 | 5/2003 | Ando |
| 6,563,733 | B2 | 5/2003 | Liu et al. |
| 6,566,177 | B1 | 5/2003 | Radens et al. |
| 6,567,330 | B2 | 5/2003 | Fujita et al. |
| 6,573,566 | B2 | 6/2003 | Ker et al. |
| 6,574,135 | B1 | 6/2003 | Komatsuzaki |
| 6,590,258 | B2 | 7/2003 | Divakauni et al. |
| 6,590,259 | B2 | 7/2003 | Adkisson et al. |
| 6,617,651 | B2 | 9/2003 | Ohsawa |
| 6,621,725 | B2 | 9/2003 | Ohsawa |
| 6,632,723 | B2 | 10/2003 | Watanabe et al. |
| 6,650,565 | B1 | 11/2003 | Ohsawa |
| 6,653,175 | B1 | 11/2003 | Nemati et al. |
| 6,686,624 | B2 | 2/2004 | Hsu |
| 6,700,826 | B2 * | 3/2004 | Ito ................................. 365/222 |
| 6,703,673 | B2 | 3/2004 | Houston |
| 6,707,118 | B2 | 3/2004 | Muljono et al. |
| 6,714,436 | B1 | 3/2004 | Burnett et al. |
| 6,721,222 | B2 | 4/2004 | Somasekhar et al. |
| 6,825,524 | B1 * | 11/2004 | Ikehashi et al. ............... 257/314 |
| 6,861,689 | B2 | 3/2005 | Burnett |
| 6,870,225 | B2 | 3/2005 | Bryant et al. |
| 6,882,566 | B2 | 4/2005 | Nejad et al. |
| 6,888,770 | B2 | 5/2005 | Ikehashi |
| 6,894,913 | B2 | 5/2005 | Yamauchi |
| 6,897,098 | B2 | 5/2005 | Hareland et al. |
| 6,903,984 | B1 | 6/2005 | Tang et al. |
| 6,909,151 | B2 | 6/2005 | Hareland et al. |
| 6,912,150 | B2 | 6/2005 | Portman et al. |
| 6,913,964 | B2 | 7/2005 | Hsu |
| 6,936,508 | B2 | 8/2005 | Visokay et al. |
| 6,969,662 | B2 | 11/2005 | Fazan et al. |
| 6,975,536 | B2 | 12/2005 | Maayan et al. |
| 6,982,902 | B2 | 1/2006 | Gogl et al. |
| 6,987,041 | B2 | 1/2006 | Ohkawa |
| 7,030,436 | B2 | 4/2006 | Forbes |
| 7,037,790 | B2 | 5/2006 | Chang et al. |
| 7,041,538 | B2 | 5/2006 | Ieong et al. |
| 7,042,765 | B2 | 5/2006 | Sibigtroth et al. |
| 7,061,806 | B2 | 6/2006 | Tang et al. |
| 7,085,153 | B2 | 8/2006 | Ferrant et al. |
| 7,085,156 | B2 | 8/2006 | Ferrant et al. |
| 7,170,807 | B2 | 1/2007 | Fazan et al. |
| 7,177,175 | B2 | 2/2007 | Fazan et al. |
| 7,187,581 | B2 | 3/2007 | Ferrant et al. |
| 7,230,846 | B2 | 6/2007 | Keshavarzi |
| 7,233,024 | B2 | 6/2007 | Scheuerlein et al. |
| 7,251,179 | B2 * | 7/2007 | Ohsawa ....................... 365/222 |
| 7,256,459 | B2 | 8/2007 | Shino |
| 7,301,803 | B2 | 11/2007 | Okhonin et al. |
| 7,301,838 | B2 | 11/2007 | Waller |
| 7,317,641 | B2 | 1/2008 | Scheuerlein |
| 7,324,387 | B1 | 1/2008 | Bergemont et al. |
| 7,335,934 | B2 | 2/2008 | Fazan |
| 7,341,904 | B2 | 3/2008 | Willer |
| 7,416,943 | B2 | 8/2008 | Figura et al. |

| | | |
|---|---|---|
| 7,436,706 B2 * | 10/2008 | Popoff et al. ............ 365/185.14 |
| 7,440,353 B2 * | 10/2008 | Kim et al. .................... 365/222 |
| 7,456,439 B1 | 11/2008 | Horch |
| 7,477,540 B2 | 1/2009 | Okhonin et al. |
| 7,492,632 B2 | 2/2009 | Carman |
| 7,517,744 B2 | 4/2009 | Mathew et al. |
| 7,539,041 B2 | 5/2009 | Kim et al. |
| 7,542,340 B2 | 6/2009 | Fisch et al. |
| 7,542,345 B2 | 6/2009 | Okhonin et al. |
| 7,545,694 B2 | 6/2009 | Srinivasa Raghavan et al. |
| 7,606,066 B2 | 10/2009 | Okhonin et al. |
| 7,696,032 B2 | 4/2010 | Kim et al. |
| 7,804,731 B2 * | 9/2010 | Ohsawa ....................... 365/222 |
| 8,014,195 B2 * | 9/2011 | Okhonin et al. ............ 365/177 |
| 2001/0055859 A1 | 12/2001 | Yamada et al. |
| 2002/0030214 A1 | 3/2002 | Horiguchi |
| 2002/0034855 A1 | 3/2002 | Horiguchi et al. |
| 2002/0036322 A1 | 3/2002 | Divakauni et al. |
| 2002/0051378 A1 | 5/2002 | Ohsawa |
| 2002/0064913 A1 | 5/2002 | Adkisson et al. |
| 2002/0070411 A1 | 6/2002 | Vermandel et al. |
| 2002/0072155 A1 | 6/2002 | Liu et al. |
| 2002/0076880 A1 | 6/2002 | Yamada et al. |
| 2002/0086463 A1 | 7/2002 | Houston et al. |
| 2002/0089038 A1 | 7/2002 | Ning |
| 2002/0098643 A1 | 7/2002 | Kawanaka et al. |
| 2002/0110018 A1 | 8/2002 | Ohsawa |
| 2002/0114191 A1 | 8/2002 | Iwata et al. |
| 2002/0130341 A1 | 9/2002 | Horiguchi et al. |
| 2002/0160581 A1 | 10/2002 | Watanabe et al. |
| 2002/0180069 A1 | 12/2002 | Houston |
| 2003/0003608 A1 | 1/2003 | Arikado et al. |
| 2003/0015757 A1 | 1/2003 | Ohsawa |
| 2003/0035324 A1 | 2/2003 | Fujita et al. |
| 2003/0042516 A1 | 3/2003 | Forbes et al. |
| 2003/0047784 A1 | 3/2003 | Matsumoto et al. |
| 2003/0057487 A1 | 3/2003 | Yamada et al. |
| 2003/0057490 A1 | 3/2003 | Nagano et al. |
| 2003/0102497 A1 | 6/2003 | Fried et al. |
| 2003/0112659 A1 | 6/2003 | Ohsawa |
| 2003/0123279 A1 | 7/2003 | Aipperspach et al. |
| 2003/0146474 A1 | 8/2003 | Ker et al. |
| 2003/0146488 A1 | 8/2003 | Nagano et al. |
| 2003/0151112 A1 | 8/2003 | Yamada et al. |
| 2003/0231521 A1 | 12/2003 | Ohsawa |
| 2004/0021137 A1 | 2/2004 | Fazan et al. |
| 2004/0021179 A1 | 2/2004 | Lee |
| 2004/0029335 A1 | 2/2004 | Lee et al. |
| 2004/0075143 A1 | 4/2004 | Bae et al. |
| 2004/0108532 A1 | 6/2004 | Forbes et al. |
| 2004/0188714 A1 | 9/2004 | Scheuerlein et al. |
| 2004/0217420 A1 | 11/2004 | Yeo et al. |
| 2005/0001257 A1 | 1/2005 | Schloesser et al. |
| 2005/0001269 A1 | 1/2005 | Hayashi et al. |
| 2005/0017240 A1 | 1/2005 | Fazan |
| 2005/0047240 A1 | 3/2005 | Ikehashi et al. |
| 2005/0062088 A1 | 3/2005 | Houston |
| 2005/0063224 A1 | 3/2005 | Fazan et al. |
| 2005/0064659 A1 | 3/2005 | Willer |
| 2005/0105342 A1 | 5/2005 | Tang et al. |
| 2005/0111255 A1 | 5/2005 | Tang et al. |
| 2005/0121710 A1 | 6/2005 | Shino |
| 2005/0135169 A1 | 6/2005 | Somasekhar et al. |
| 2005/0141262 A1 | 6/2005 | Yamada et al. |
| 2005/0141290 A1 | 6/2005 | Tang et al. |
| 2005/0145886 A1 | 7/2005 | Keshavarzi et al. |
| 2005/0145935 A1 | 7/2005 | Keshavarzi et al. |
| 2005/0167751 A1 | 8/2005 | Nakajima et al. |
| 2005/0189576 A1 | 9/2005 | Ohsawa |
| 2005/0208716 A1 | 9/2005 | Takaura et al. |
| 2005/0226070 A1 | 10/2005 | Ohsawa |
| 2005/0232043 A1 | 10/2005 | Ohsawa |
| 2005/0242396 A1 | 11/2005 | Park et al. |
| 2005/0265107 A1 | 12/2005 | Tanaka |
| 2006/0043484 A1 | 3/2006 | Cabral et al. |
| 2006/0091462 A1 | 5/2006 | Okhonin et al. |
| 2006/0098481 A1 | 5/2006 | Okhonin et al. |
| 2006/0126374 A1 | 6/2006 | Waller et al. |
| 2006/0131650 A1 | 6/2006 | Okhonin et al. |
| 2006/0223302 A1 | 10/2006 | Chang et al. |
| 2007/0008811 A1 | 1/2007 | Keeth et al. |
| 2007/0023833 A1 | 2/2007 | Okhonin et al. |
| 2007/0045709 A1 | 3/2007 | Yang |
| 2007/0058427 A1 | 3/2007 | Okhonin et al. |
| 2007/0064489 A1 | 3/2007 | Bauser |
| 2007/0085140 A1 | 4/2007 | Bassin |
| 2007/0097751 A1 | 5/2007 | Popoff et al. |
| 2007/0114599 A1 | 5/2007 | Hshieh |
| 2007/0133330 A1 | 6/2007 | Ohsawa |
| 2007/0138524 A1 | 6/2007 | Kim et al. |
| 2007/0138530 A1 | 6/2007 | Okhonin et al. |
| 2007/0187751 A1 | 8/2007 | Hu et al. |
| 2007/0187775 A1 | 8/2007 | Okhonin et al. |
| 2007/0200176 A1 | 8/2007 | Kammler et al. |
| 2007/0252205 A1 | 11/2007 | Hoentschel et al. |
| 2007/0263466 A1 | 11/2007 | Morishita et al. |
| 2007/0278578 A1 | 12/2007 | Yoshida et al. |
| 2008/0049486 A1 | 2/2008 | Gruening-von Schwerin |
| 2008/0083949 A1 | 4/2008 | Zhu et al. |
| 2008/0099808 A1 | 5/2008 | Burnett et al. |
| 2008/0130379 A1 | 6/2008 | Ohsawa |
| 2008/0133849 A1 | 6/2008 | Demi et al. |
| 2008/0165577 A1 | 7/2008 | Fazan et al. |
| 2008/0253179 A1 | 10/2008 | Slesazeck |
| 2008/0258206 A1 | 10/2008 | Hofmann |
| 2009/0086535 A1 | 4/2009 | Ferrant et al. |
| 2009/0121269 A1 | 5/2009 | Caillat et al. |
| 2009/0127592 A1 | 5/2009 | El-Kareh et al. |
| 2009/0201723 A1 | 8/2009 | Okhonin et al. |
| 2010/0085813 A1 | 4/2010 | Shino |
| 2010/0091586 A1 | 4/2010 | Carman |
| 2010/0110816 A1 | 5/2010 | Nautiyal et al. |

FOREIGN PATENT DOCUMENTS

| | | |
|---|---|---|
| EP | 0 030 856 | 6/1981 |
| EP | 0 350 057 | 1/1990 |
| EP | 0 354 348 | 2/1990 |
| EP | 0 202 515 | 3/1991 |
| EP | 0 207 619 | 8/1991 |
| EP | 0 175 378 | 11/1991 |
| EP | 0 253 631 | 4/1992 |
| EP | 0 513 923 | 11/1992 |
| EP | 0 300 157 | 5/1993 |
| EP | 0 564 204 | 10/1993 |
| EP | 0 579 566 | 1/1994 |
| EP | 0 362 961 | 2/1994 |
| EP | 0 599 506 | 6/1994 |
| EP | 0 359 551 | 12/1994 |
| EP | 0 366 882 | 5/1995 |
| EP | 0 465 961 | 8/1995 |
| EP | 0 694 977 | 1/1996 |
| EP | 0 333 426 | 7/1996 |
| EP | 0 727 820 | 8/1996 |
| EP | 0 739 097 | 10/1996 |
| EP | 0 245 515 | 4/1997 |
| EP | 0 788 165 | 8/1997 |
| EP | 0 801 427 | 10/1997 |
| EP | 0 510 607 | 2/1998 |
| EP | 0 537 677 | 8/1998 |
| EP | 0 858 109 | 8/1998 |
| EP | 0 860 878 | 8/1998 |
| EP | 0 869 511 | 10/1998 |
| EP | 0 878 804 | 11/1998 |
| EP | 0 920 059 | 6/1999 |
| EP | 0 924 766 | 6/1999 |
| EP | 0 642 173 | 7/1999 |
| EP | 0 727 822 | 8/1999 |
| EP | 0 933 820 | 8/1999 |
| EP | 0 951 072 | 10/1999 |
| EP | 0 971 360 | 1/2000 |
| EP | 0 980 101 | 2/2000 |
| EP | 0 601 590 | 4/2000 |
| EP | 0 993 037 | 4/2000 |
| EP | 0 836 194 | 5/2000 |
| EP | 0 599 388 | 8/2000 |
| EP | 0 689 252 | 8/2000 |
| EP | 0 606 758 | 9/2000 |
| EP | 0 682 370 | 9/2000 |

| | | |
|---|---|---|
| EP | 1 073 121 | 1/2001 |
| EP | 0 726 601 | 9/2001 |
| EP | 0 731 972 | 11/2001 |
| EP | 1 162 663 | 12/2001 |
| EP | 1 162 744 | 12/2001 |
| EP | 1 179 850 | 2/2002 |
| EP | 1 180 799 | 2/2002 |
| EP | 1 191 596 | 3/2002 |
| EP | 1 204 146 | 5/2002 |
| EP | 1 204 147 | 5/2002 |
| EP | 1 209 747 | 5/2002 |
| EP | 0 744 772 | 8/2002 |
| EP | 1 233 454 | 8/2002 |
| EP | 0 725 402 | 9/2002 |
| EP | 1 237 193 | 9/2002 |
| EP | 1 241 708 | 9/2002 |
| EP | 1 253 634 | 10/2002 |
| EP | 0 844 671 | 11/2002 |
| EP | 1 280 205 | 1/2003 |
| EP | 1 288 955 | 3/2003 |
| FR | 2 197 494 | 3/1974 |
| GB | 1 414 228 | 11/1975 |
| JP | H04-176163 A | 6/1922 |
| JP | S62-007149 A | 1/1987 |
| JP | 62-272561 | 11/1987 |
| JP | 02-294076 | 12/1990 |
| JP | 03-171768 | 7/1991 |
| JP | 05-347419 | 12/1993 |
| JP | 08-213624 | 8/1996 |
| JP | H08-213624 A | 8/1996 |
| JP | 08-274277 | 10/1996 |
| JP | H08-316337 A | 11/1996 |
| JP | 09-046688 | 2/1997 |
| JP | 09-082912 | 3/1997 |
| JP | 10-242470 | 9/1998 |
| JP | 11-087649 | 3/1999 |
| JP | 2000-247735 A | 8/2000 |
| JP | 12-274221 A | 9/2000 |
| JP | 12-389106 A | 12/2000 |
| JP | 13-180633 A | 6/2001 |
| JP | 2002-009081 | 1/2002 |
| JP | 2002-083945 | 3/2002 |
| JP | 2002-094027 | 3/2002 |
| JP | 2002-176154 | 6/2002 |
| JP | 2002-246571 | 8/2002 |
| JP | 2002-329795 | 11/2002 |
| JP | 2002-343886 | 11/2002 |
| JP | 2002-353080 | 12/2002 |
| JP | 2003-031693 | 1/2003 |
| JP | 2003-68877 A | 3/2003 |
| JP | 2003-086712 | 3/2003 |
| JP | 2003-100641 | 4/2003 |
| JP | 2003-100900 | 4/2003 |
| JP | 2003-132682 | 5/2003 |
| JP | 2003-203967 | 7/2003 |
| JP | 2003-243528 | 8/2003 |
| JP | 2004-335553 | 11/2004 |
| WO | WO 01/24268 | 4/2001 |
| WO | WO 2005/008778 | 1/2005 |

OTHER PUBLICATIONS

Arimoto, A High-Density Scalable Twin Transistor RAM (TTRAM) With Verify Control for SOI Platform Memory IPs, Nov. 2007, Solid-State Circuits.

Asian Technology Information Program (ATIP) Scoops™, "Novel Capacitorless 1T-DRAM From Single-Gate PD-SOI to Double-Gate FinDRAM", May 9, 2005, 9 pages.

Assaderaghi et al., "A Dynamic Threshold Voltage MOSFET (DTMOS) for Ultra-Low Voltage Operation", IEEE IEDM, 1994, pp. 809-812.

Assaderaghi et al., "A Dynamic Threshold Voltage MOSFET (DTMOS) for Very Low Voltage Operation", IEEE Electron Device Letters, vol. 15, No. 12, Dec. 1994, pp. 510-512.

Assaderaghi et al., "A Novel Silicon-On-Insulator (SOI) MOSFET for Ultra Low Voltage Operation", 1994 IEEE Symposium on Low Power Electronics, pp. 58-59.

Assaderaghi et al., "Dynamic Threshold-Voltage MOSFET (DTMOS) for Ultra-Low Voltage VLSI", IEEE Transactions on Electron Devices, vol. 44, No. 3, Mar. 1997, pp. 414-422.

Assaderaghi et al., "High-Field Transport of Inversion-Layer Electrons and Holes Including Velocity Overshoot", IEEE Transactions on Electron Devices, vol. 44, No. 4, Apr. 1997, pp. 664-671.

Avci, Floating Body Cell (FBC) Memory for 16-nm Technology with Low Variation on Thin Silicon and 10-nm BOX, Oct. 2008, SOI Conference.

Bae, Evaluation of 1T RAM using Various Operation Methods with SOONO (Silicon-On-ONO) device, Dec. 2008, IEDM.

Ban, A Scaled Floating Body Cell (FBC) Memory with High-k+Metal Gate on Thin-Silicon and Thin-BOX for 16-nm Technology Node and Beyond, Jun. 2008, VLSI Symposium.

Ban, Ibrahim, et al., "Floating Body Cell with Independently-Controlled Double Gates for High Density Memory," Electron Devices Meeting, 2006. IEDM '06. International, IEEE, Dec. 11-13, 2006.

Bawedin, Maryline, et al., A Capacitorless 1T Dram on SOI Based on Dynamic Coupling and Double-Gate Operation, IEEE Electron Device Letters, vol. 29, No. 7, Jul. 2008.

Blagojevic et al., Capacitorless 1T DRAM Sensing Scheme Automatice Reference Generation, 2006, IEEE J.Solid State Circuits.

Blalock, T., "A High-Speed Clamped Bit-Line Current-Mode Sense Amplifier", IEEE Journal of Solid-State Circuits, vol. 26, No. 4, Apr. 1991, pp. 542-548.

Butt, Scaling Limits of Double Gate and Surround Gate Z-RAM Cells, 2007, IEEE Trans. On El. Dev.

Chan et al., "Effects of Floating Body on Double Polysilicon Partially Depleted SOI Nonvolatile Memory Cell", IEEE Electron Device Letters, vol. 24, No. 2, Feb. 2003, pp. 75-77.

Chan, et al., "SOI MOSFET Design for All-Dimensional Scaling with Short Channel, Narrow Width and Ultra-thin Films", IEEE IEDM, 1995, pp. 631-634.

Chi et al., "Programming and Erase with Floating-Body for High Density Low Voltage Flash EEPROM Fabricated on SOI Wafers", Proceedings 1995 IEEE International SOI Conference, Oct. 1995, pp. 129-130.

Cho et al., "Novel DRAM Cell with Amplified Capacitor for Embedded Application", IEEE, Jun. 2009.

Cho, A novel capacitor-less DRAM cell using Thin Capacitively-Coupled Thyristor (TCCT), 2005, IEDM.

Choi et al., Current Flow Mechanism in Schottky-Barrier MOSFET and Application to the 1T-DRAM, 2008, SSDM.

Choi, High Speed Flash Memory and 1T-DRAM on Dopant Segregated Schottky Barrier (DSSB) FinFET SONOS Device for Multi-functional SoC Applications, Dec. 2008, IEDM.

Clarke, Junctionless Transistors Could Simply Chip Making, Say Researchers, EE Times, Feb. 2010, www.eetimes.com/showArticle.jhtml?articleID=223100050.

Colinge, J.P., "An SOI voltage-controlled bipolar-MOS device", IEEE Transactions on Electron Devices, vol. ED-34, No. 4, Apr. 1987, pp. 845-849.

Colinge, Nanowire Transistors Without Junctions, Nature NanoTechnology, vol. 5, 2010, pp. 225-229.

Collaert et al., Optimizing the Readout Bias for the Capacitorless 1T Bulk FinFET RAM Cell, 2009, IEEE EDL.

Collaert, Comparison of scaled floating body RAM architectures, Oct. 2008, SOI Conference.

Ershov, Optimization of Substrate Doping for Back-Gate Control in SOI T-RAM Memory Technology, 2005, SOI Conference.

Ertosun et al., A Highly Scalable Capacitorless Double Gate Quantum Well Single Transistor DRAM: 1T-QW DRAM, 2008, IEEE EDL.

Fazan et al., "A Simple 1-Transistor Capacitor-Less Memory Cell for High Performance Embedded DRAMs", IEEE 2002 Custom Integrated Circuits Conference, Jun. 2002, pp. 99-102.

Fazan, A Highly Manufacturable Capacitor-less 1T-DRAM Concept, 2002, SPIE.

Fazan, et al., "Capacitor-Less 1-Transistor DRAM", 2002 IEEE International SOI Conference, Oct. 2002, pp. 10-13.

Fazan, P., "MOSFET Design Simplifies DRAM", EE Times, May 14, 2002 (3 pages).

Fisch, Beffa, Bassin, Soft Error Performance of Z-RAM Floating Body Memory, 2006, SOI Conference.

Fisch, Carman, Customizing SOI Floating Body Memory Architecture for System Performance and Lower Cost, 2006, SAME.

Fisch, Z-RAM® Ultra-Dense Memory for 90nm and Below, 2006, Hot Chips.

Fossum et al., New Insights on Capacitorless Floating Body DRAM Cells, 2007, IEEE EDL.

Fujita, Array Architectureof Floating Body Cell (FBC) with Quasi-Shielded Open Bit Line Scheme for sub-40nm Node, 2008, SOI Conference.

Furuhashi, Scaling Scenario of Floating Body Cell (FBC) Suppressing Vth Variation Due to Random Dopant Fluctuation, Dec. 2008, SOI Conference.

Furuyama et al., "An Experimental 2-bit/Cell Storage DRAM for Macrocell or Memory-on-Logic Application", IEEE Journal of Solid-State Circuits, vol. 24, No. 2, Apr. 1989, pp. 388-393.

Giffard et al., "Dynamic Effects in SOI MOSFET's", IEEE, 1991, pp. 160-161.

Gupta et al., SPICE Modeling of Self Sustained Operation (SSO) to Program Sub90nm Floating Body Cells, Oct. 2009, Conf on Simulation of Semiconductor Processes & Devices.

Han et al., Bulk FinFET Unified-RAM (URAM) Cell for Multifunctioning NVM and Capacitorless 1T-DRAM, 2008, IEEE EDL.

Han et al., Partially Depleted Sonos FinFET for Unified RAM (URAM) Unified Function for High-Speed 1T DRAM and Nonvolatile Memory, 2008, IEEE EDL.

Han, Energy Band Engineered Unified-RAM (URAM) for Multi-Functioning 1T-DRAM and NVM, Dec. 2008, IEDM.

Han, Parasitic BJT Read Method for High-Performance Capacitorless 1T-DRAM Mode in Unified RAM, Oct. 2009, IEEE EDL.

Hara, Y., "Toshiba's DRAM Cell Piggybacks on SOI Wafer", EE Times, Jun. 2003.

Hu, C., "SOI (Silicon-on-Insulator) for High Speed Ultra Large Scale Integration", Jpn. J. Appl. Phys. vol. 33 (1994) pp. 365-369, Part 1, No. 1B, Jan. 1994.

Idei et al., "Soft-Error Characteristics in Bipolar Memory Cells with Small Critical Charge", IEEE Transactions on Electron Devices, vol. 38, No. 11, Nov. 1991, pp. 2465-2471.

Ikeda et al., "3-Dimensional Simulation of Turn-off Current in Partially Depleted SOI MOSFETs", IEIC Technical Report, Institute of Electronics, Information and Communication Engineers, 1998, vol. 97, No. 557 (SDM97 186-198), pp. 27-34.

Inoh et al., "FBC (Floating Body Cell) for Embedded DRAM on SOI", 2003 Symposium on VLSI Circuits Digest of Technical Papers, Jun. 2003 (2 pages).

Iyer et al., "SOI MOSFET on Low Cost SPIMOX Substrate", IEEE IEDM, Sep. 1998, pp. 1001-1004.

Jang et al., Highly scalable Z-RAM with remarkably long data retention for DRAM application, Jun. 2009, VLSI.

Jeong et al., "A Capacitor-less 1T DRAM Cell Based on a Surrounding Gate MOSFET with Vertical Channel", Technology Development Team, Technology Development Team, Samsung Electronics Co., Ltd., May 2007.

Jeong et al., "A New Capacitorless 1T DRAm Cell: Surrounding Gate MOSFET with Vertical Channel (SGVC Cell)", IEEE Transactions on Nanotechnology, vol. 6, No. 3, May 2007.

Jeong et al., "Capacitorless DRAM Cell with Highly Scalable Surrounding Gate Structure", Extended Abstracts of the 2006 International Conference on Solid State Devices and Materials, pp. 574-575, Yokohama (2006).

Jeong et al., "Capacitorless Dynamic Random Access Memory Cell with Highly Scalable Surrounding Gate Structure", Japanese Journal of Applied Physics, vol. 46, No. 4B, pp. 2143-2147 (2007).

Kedzierski, J.; "Design Analysis of Thin-Body Silicide Source/Drain Devices", 2001 IEEE International SOI Conference, Oct. 2001, pp. 21-22.

Kim et al., "Chip Level Reliability on SOI Embedded Memory", Proceedings 1998 IEEE International SOI Conference, Oct. 1998, pp. 135-139.

Kuo et al., "A Capacitorless Double-Gate DRAM Cell Design for High Density Applications", IEEE IEDM, Feb. 2002, pp. 843-846.

Kuo et al., "A Capacitorless Double-Gate DRAM Cell", IEEE Electron Device Letters, vol. 23, No. 6, Jun. 2002, pp. 345-347.

Kuo et al., A Capacitorless Double Gate DRAM Technology for Sub 100 nm Embedded and Stand Alone Memory Applications, 2003, IEEE Trans. On El. Dev.

Kwon et al., "A Highly Scalable 4F2 DRAm Cell Utilizing a Doubly Gated Vertical Channel", Extended Abstracts of the 2009 International Conference on Solid State Devices and Materials, UC Berkley, pp. 142-143 Sendai (2009).

Lee et al., "A Novel Pattern Transfer Process for Bonded SOI Gigabit DRAMs", Proceedings 1996 IEEE International SOI Conference, Oct. 1996, pp. 114-115.

Leiss et al., dRAM Design Using the Taper-Isolated Dynamic RAM Cell, IEEE Transactions on Electron Devices, vol. ED-29, No. 4, Apr. 1982, pp. 707-714.

Lin et al., "Opposite Side Floating Gate SOI FLASH Memory Cell", IEEE, Mar. 2000, pp. 12-15.

Liu et al., Surface Generation-Recombination Processes of Gate and STI Oxide Interfaces Responsible for Junction Leakage on SOI, Sep. 2009, ECS Transactions, vol. 25.

Liu, Surface Recombination-Generation Processes of Gate, STI and Buried Oxide Interfaces Responsible for Junction Leakage on SOI, May 2009, ICSI.

Lončar et al., "One of Application of SOI Memory Cell—Memory Array", IEEE Proc. 22nd International Conference on Microelectronics (MIEL 2000), vol. 2, NIŠ, Serbia, May 14-17, 2000, pp. 455-458.

Lu et al., A Novel Two-Transistor Floating Body/Gate Cell for Low Power Nanoscale Embedded DRAM, 2008, IEEE Trans. On El. Dev.

Ma, et al., "Hot-Carrier Effects in Thin-Film Fully Depleted SOI MOSFET's", IEEE Electron Device Letters, vol. 15, No. 6, Jun. 1994, pp. 218-220.

Malhi et al., "Characteristics and Three-Dimensional Integration of MOSFET's in Small-Grain LPCVD Polycrystalline Silicon", IEEE Transactions on Electron Devices, vol. ED-32, No. 2, Feb. 1985, pp. 258-281.

Malinge, An 8Mbit DRAM Design Using a 1TBulk Cell, 2005, VLSI Circuits.

Mandelman et al, "Floating-Body Concerns for SOI Dynamic Random Access Memory (DRAM)", Proceedings 1996 IEEE International SOI Conference, Oct. 1996, pp. 136-137.

Matsuoka et al., FBC Potential of 6F2 Single Cell Operation in Multi Gbit Memories Confirmed by a Newly Developed Method for Measuring Signal Sense Margin, 2007, IEDM.

Minami, A Floating Body Cell (FBC) fully Compatible with 90nm CMOS Technology(CMOS IV) for 128Mb SOI DRAM, 2005, IEDM.

Mohapatra et al., Effect of Source/Drain Asymmetry on the Performance of Z-RAMO Devices, Oct. 2009, SOI conference.

Morishita, A Capacitorless Twin-Transistor Random Access Memory (TTRAM) on SOI, 2005, CICC.

Morishita, F. et al., "A Configurable Enhanced TTRAM Macro for System-Level Power Management Unified Memory", IEEE Journal of Solid-State Circuits, vol. 42, No. 4, pp. 853, Apr. 2007.

Morishita, F., et al., "A 312-MHz 16-Mb Random-Cycle Embedded DRAM Macro With a Power-Down Data Retention Mode for Mobile Applications", J. Solid-State Circuits, vol. 40, No. 1, pp. 204-212, 2005.

Morishita, F., et al., "Dynamic floating body control SOI CMOS for power managed multimedia ULSIs", Proc. CICC, pp. 263-266, 1997.

Morishita, F., et al., "Leakage Mechanism due to Floating Body and Countermeasure on Dynamic Retention Mode of SOI-DRAM", Symposium on VLSI Technology Digest of Technical Papers, pp. 141-142, 1995.

Nagoga, Studying of Hot Carrier Effect in Floating Body Soi MOSFETs by the Transient Charge Pumping Technique, Switzerland 2003.

Nayfeh, A Leakage Current Model for SOI based Floating Body Memory that Includes the Poole-Frenkel Effect, 2008, SOI Conference.

Nemati, A Novel High Density, Low Voltage SRAM Cell with a Vertical NDR Device, 1998, VLSI Tech. Symp.

Nemati, A Novel Thyristor-based SRAM Cell (T-RAM) for High-Speed, Low-Voltage, Giga-scale Memories, 1999, IEDM Conference.

Nemati, Embedded Volatile Memories-Embedded Tutorial: The New Memory Revolution, New Drives Circuits and Systems, ICCAD 2008, Nov. 2008.

Nemati, Fully Planar 0.562 μm2 T-RAM Cell in a 130nm SOI CMOS Logic Technology for High-Density High-Performance SRAMs, 2004, IEDM.

Nemati, The New Memory Revolution. New Devices, Circuits and Systems, 2008, ICCAD.

Nemati, Thyristor RAM (T-RAM): A High-Speed High-Density Embedded Memory Technology for Nano-scale CMOS, 2007, Hot Chips.

Nemati, Thyristor-RAM: A Novel Embedded Memory Technology that Outperforms Embedded S RAM/DRAM, 2008, Linley Tech Tour.

Nishiguchi et al., Long Retention of Gain-Cell Dynamic Random Access Memory with Undoped Memory Node, 2007, IEEE EDL.

Oh, Floating Body DRAM Characteristics of Silicon-On-ONO (SOONO) Devices for System-on-Chip (SoC) Applications, 2007, VLSI Symposium.

Ohno et al., "Suppression of Parasitic Bipolar Action in Ultra-Thin-Film Fully-Depleted CMOS/SIMOX Devices by Ar-Ion Implantation into Source/Drain Regions", IEEE Transactions on Electron Devices, vol. 45, No. 5, May 1998, pp. 1071-1076.

Ohsawa et al., "A Memory Using One-Transistor Gain Cell on SOI (FBC) with Performance Suitable for Embedded DRAM's", 2003 Symposium on VLSI Circuits Digest of Technical Papers, Jun. 2003 (4 pages).

Ohsawa et al., "Memory Design Using a One-Transistor Gain Cell on SOI", IEEE Journal of Solid-State Circuits, vol. 37, No. 11, Nov. 2002, pp. 1510-1522.

Ohsawa, A 128Mb Floating Body RAM (FBRAM) on SOI with a Multi-Averaging Scheme of Dummy Cell, 2006 Symposium of VLSI Circuits Digest of Tech Papers, (2006).

Ohsawa, An 18.5ns 128Mb SOI DRAM with a Floating Body Cell, 2005, ISSCC.

Ohsawa, Autonomous Refresh of Floating Body Cell (FBC), Dec. 2008, IEDM.

Ohsawa, Design of a 128-Mb SOI DRAM Using the Floating Body Cell (FBC), Jan. 2006, Solid-State Circuits.

Okhonin, a Capacitor-Less 1T-DRAM Cell, Feb. 2002, Electron Device Letters.

Okhonin, A SOI Capacitor-less 1T-DRAM Concept, 2001, SOI Conference.

Okhonin, Charge Pumping Effects in Partially Depleted SOI MOSFETs, 2003, SOI Conference.

Okhonin, New characterization techniques for SOI and related devices, 2003, ECCTD.

Okhonin, New Generation of Z-RAM, 2007, IEDM.

Okhonin, Principles of Transient Charge Pumping on Partially Depleted SOI MOSFETs, May 2002, Electron Device Letters.

Okhonin, Transient Charge Pumping for Partially and Fully Depleted SOI MOSFETs, 2002, SOI Conference.

Okhonin, Transient effects in PD SOI MOSFETs and potential DRAM applications, 2002, Solid-State Electronics.

Okhonin, Ultra-scaled Z-RAM cell, 2008, SOI Conference.

Okhonin, Z-RAM® (Limits of DRAM), 2009, ESSDERC.

Padilla, Alvaro, et al., "Feedback FET: A Novel Transistor Exhibiting Steep Switching Behavior at Low Bias Voltages," Electron Devices Meeting, 2008. IEDM 2008. IEEE International, Dec. 5-17, 2008.

Park, Fully Depleted Double-Gate 1T-DRAM Cell with NVM Function for High Performance and High Density Embedded DRAM, 2009, IMW.

Pelella et al., "Low-Voltage Transient Bipolar Effect Induced by Dynamic Floating-Body Charging in PD/SOI MOSFETs", Final Camera Ready Art, SOI Conference, Oct. 1995, 2 pages.

Portmann et al., "A SOI Current Memory for Analog Signal Processing at High Temperature", 1999 IEEE International SOI Conference, Oct. 1999, pp. 18-19.

Puget et al., 1T Bulk eDRAM using GIDL Current for High Speed and Low Power applications, 2008, SSDM.

Puget et al., Quantum effects influence on thin silicon film capacitor-less DRAM performance, 2006, SOI Conference.

Puget, FDSOI Floating Body Cell eDRAM Using Gate-Induced Drain-Leakage (GIDL) Write Current for High Speed and Low Power Applications, 2009, IMW.

Ranica et al., 1T-Bulk DRAM cell with improved performances: the way to scaling, 2005, ICMTD.

Ranica, A capacitor-less DRAM cell on 75nm gate length, 16nm thin Fully Depleted SOI device for high density embedded memories, 2004, IEDM.

Ranica, A One Transistor Cell on Bulk Substrate (1T-Bulk) for Low-Cost and High Density eDRAM, 2004, VLSI Symposium.

Rodder et al., "Silicon-On-Insulator Bipolar Transistors", IEEE Electron Device Letters, vol. EDL-4, No. 6, Jun. 1983, pp. 193-195.

Rodriguez, Noel, et al., A-RAM Novel Capacitor-less Dram Memory, SOI Conference, 2009 IEEE International, Oct. 5-8, 2009 pp. 1-2.

Roy, Thyristor-Based Volatile Memory in Nano-Scale CMOS, 2006, ISSCC.

Salling et al., Reliability of Thyristor Based Memory Cells, 2009, IRPS.

Sasaki et al., Charge Pumping in SOS-MOS Transistors, 1981, IEEE Trans. On El. Dev.

Sasaki et al., Charge Pumping SOS-MOS Transistor Memory, 1978, IEDM.

Schloesser et al., "A 6F2 Buried Wordline DRAM Cell for 40nm and Beyond", IEEE, Qimonda Dresden GmbH & Co., pp. 809-812 (2008).

Shino et al., Floating Body RAM technology and its scalability to 32 nm node and beyond, 2006, IEDM.

Shino et al., Operation Voltage Dependence of Memory Cell Characteristics in Fully Depleted FBC, 2005, IEEE Trans. On El. Dev.

Shino, Fully-Depleted FBC (Floating Body Cell) with Enlarged Signal Window and Excellent Logic Process Compatibility, 2004, IEDM.

Shino, Highly Scalable FBC (Floating Body Cell) with 25nm BOX Structure for Embedded DRAM Applications, 2004, VLSI Symposium.

Sim et al., "Source-Bias Dependent Charge Accumulation in P+-Poly Gate SOI Dynamic Random Access Memory Cell Transistors", Jpn. J. Appl. Phys. vol. 37 (1998) pp. 1260-1263, Part 1, No. 3B, Mar. 1998.

Singh, A 2ns-Read-Latency 4Mb Embedded Floating-Body Memory Macro in 45nm SOI Technology, Feb. 2009, ISSCC.

Sinha et al., "In-Depth Analysis of Opposite Channel Based Charge Injection in SOI MOSFETs and Related Defect Creation and Annihilation", Elsevier Science, Microelectronic Engineering 28, 1995, pp. 383-386.

Song, 55 nm Capacitor-less 1T DRAM Cell Transistor with Non-Overlap Structure, Dec. 2008, IEDM.

Stanojevic et al., "Design of a SOI Memory Cell", IEEE Proc. 21st International Conference on Microelectronics (MIEL '97), vol. 1, NIS, Yugoslavia, Sep. 14-17, 1997, pp. 297-300.

Su et al., "Studying the Impact of Gate Tunneling on Dynamic Behaviors of Partially-Depleted SOI CMOS Using BSIMPD", IEEE Proceedings of the International Symposium on Quality Electronic Design (ISQED '02), Apr. 2002 (5 pages).

Suma et al., "An SOI-DRAM with Wide Operating Voltage Range by CMOS/SIMOX Technology", 1994 IEEE International Solid-State Circuits Conference, pp. 138-139.

Tack et al., "The Multi-Stable Behaviour of SOI-NMOS Transistors at Low Temperatures", Proc. 1988 SOS/SOI Technology Workshop (Sea Palms Resort, St. Simons Island, GA, Oct. 1988), p. 78.

Tack et al., "The Multistable Charge Controlled Memory Effect in SOI Transistors at Low Temperatures", IEEE Workshop on Low Temperature Electronics, Aug. 7-8, 1989, University of Vermont, Burlington, pp. 137-141.

Tack et al., "The Multistable Charge-Controlled Memory Effect in SOI MOS Transistors at Low Temperatures", IEEE Transactions on Electron Devices, vol. 37, No. 5, May 1990, pp. 1373-1382.

Tack, et al., "An Analytical Model for the Misis Structure in SOI MOS Devices", Solid-State Electronics vol. 33, No. 3, 1990, pp. 357-364.

Tanaka et al., "Scalability Study on a Capacitorless 1T-DRAM: From Single-gate PD-SOI to Double-gate FINDRAM", 2004 IEEE, 4 pages.

Tang, Poren, Highly Scalable Capacitorless DRAM Cell on Thin-Body with Band-gap Engineered Source and Drain, Extended Abstracts of the 2009 ICSSDM, Sendai, 2009, pp. 144-145.

Terauchi et al., "Analysis of Floating-Body-Induced Leakage Current in 0.15µ m SOI DRAM", Proceedings 1996 IEEE International SOI Conference, Oct. 1996, pp. 138-139.

Thomas et al., "An SOI 4 Transistors Self-Refresh Ultra-Low-Voltage Memory Cell", IEEE, Mar. 2003, pp. 401-404.

Tomishima, et al., "A Long Data Retention SOI DRAM with the Body Refresh Function", IEICE Trans. Electron., vol. E80-C, No. 7, Jul. 1997, pp. 899-904.

Tsaur et al., "Fully Isolated Lateral Bipolar-MOS Transistors Fabricated in Zone-Melting-Recrystallized Si Films on SiO2", IEEE Electron Device Letters, vol. EDL-4, No. 8, Aug. 1983, pp. 269-271.

Tu, et al., "Simulation of Floating Body Effect in SOI Circuits Using BSIM3SOI", Proceedings of Technical Papers (IEEE Cat No. 97TH8303), Jun. 1997, pp. 339-342.

Villaret et al., "Mechanisms of Charge Modulation in the Floating Body of Triple-Well nMOSFET Capacitor-less DRAMs", Proceedings of the IFNOS 2003, Insulating Films on Semiconductors, 13th Bi-annual Conference, Jun. 18-20, 2003, Barcelona (Spain), (4 pages).

Villaret et al., "Triple-Well nMOSFET Evaluated as a Capacitor-Less DRAM Cell for Nanoscale Low-Cost & High Density Applications", Handout at Proceedings of 2003 Silicon Nanoelectronics Workshop, Jun. 8-9, 2003, Kyoto, Japan (2 pages).

Villaret et al., Further Insight into the Physics and Modeling of Floating Body Capacitorless DRAMs, 2005, IEEE Trans. On El. Dev.

Wang et al., A Novel 4.5F2 Capacitorless Semiconductor Memory Device, 2008, IEEE EDL.

Wann et al., "A Capacitorless DRAM Cell on SOI Substrate", IEEE IEDM, 1993, pp. 635-638.

Wann et al., "High-Endurance Ultra-Thin Tunnel Oxide in MONOS Device Structure for Dynamic Memory Application", IEEE Electron Device Letters, vol. 16, No. 11, Nov. 1995, pp. 491-493.

Wei, A., "Measurement of Transient Effects in SOI DRAM/SRAM Access Transistors", IEEE Electron Device Letters, vol. 17, No. 5, May 1996, pp. 193-195.

Wouters, et al., "Characterization of Front and Back Si-SiO2 Interfaces in Thick- and Thin-Film Silicon-on-Insulator MOS Structures by the Charge-Pumping Technique", IEEE Transactions on Electron Devices, vol. 36, No. 9, Sep. 1989, pp. 1746-1750.

Wu, Dake, "Performance Improvement of the Capacitorless DRAM Cell with Quasi-SOI Structure Based on Bulk Substrate," Extended Abstracts of the 2009 ICSSDM, Sendai, 2009, pp. 146-147.

Yamanaka et al., "Advanced TFT SRAM Cell Technology Using a Phase-Shift Lithography", IEEE Transactions on Electron Devices, vol. 42, No. 7, Jul. 1995, pp. 1305-1313.

Yamauchi et al., "High-Performance Embedded SOI DRAM Architecture for the Low-Power Supply", IEEE Journal of Solid-State Circuits, vol. 35, No. 8, Aug. 2000, pp. 1169-1178.

Yamawaki, M., "Embedded DRAM Process Technology", Proceedings of the Symposium on Semiconductors and Integrated Circuits Technology, 1998, vol. 55, pp. 38-43.

Yang, Optimization of Nanoscale Thyristors on SOI for High-Performance High-Density Memories, 2006, SOI Conference.

Yoshida et al., "A Design of a Capacitorless 1-T-DRAM Cell Using Gate-induced Drain Leakage (GIDL) Current for Low-Power and High-speed Embedded Memory", 2003 IEEE, 4 pages.

Yoshida et al., "A Study of High Scalable DG-FinDRAM", IEEE Electron Device Letters, vol. 26, No. 9, Sep. 2005, pp. 655-657.

Yoshida et al., A Capacitorless 1T-DRAM Technology Using GIDL Current for Low Power and High Speed Embedded Memory, 2006, IEEE Trans. On El. Dev.

Yu et al., Hot-Carrier Effect in Ultra-Thin-Film (UTF) Fully-Depleted SOI MOSFET's, 54th Annual Device Research Conference Digest (Cat. No. 96TH8193), Jun. 1996, pp. 22-23.

Yu et al., "Hot-Carrier-Induced Degradation in Ultra-Thin-Film Fully-Depleted SOI MOSFETs", Solid-State Electronics, vol. 39, No. 12, 1996, pp. 1791-1794.

Yu et al., "Interface Characterization of Fully-Depleted SOI MOSFET by a Subthreshold I-V Method", Proceedings 1994 IEEE International SOI Conference, Oct. 1994, pp. 63-64.

Yun et al., Analysis of Sensing Margin in SOONO Device for the Capacitor-less RAM Applications, 2007, SOI Conference.

Zhou, Physical Insights on BJT-Based 1T DRAM Cells, IEEE Electron Device Letters, vol. 30, No. 5, May 2009.

Tanabe et al., A 30-ns 64-MB DRAM with Built-in-Self-Test and Self-Repair Function, IEEE Journal of Solid State Circuits, vol. 27, No. 11, pp. 1525-1533, Nov. 1992.

Ban et al., Integration of Back-Gate Doping for 15-nm Node Floating Body Cell (FBC) Memory, Components Research, Process Technology Modeling, presented in the 2010 VLSI Symposium on Jun. 17, 2010.

\* cited by examiner

300

┌─────────────────────────────────────┐
│ Continually applying first potential to gate
│ of memory cell transistor except during      │─── 302
│ read operations and write operations.        │
└─────────────────────────────────────┘
                  │
                  ▼
┌─────────────────────────────────────┐
│ Continually applying second potential across │
│ source region and a drain region of memory   │─── 304
│ cell transistor except during read operations│
│ and write operations.                        │
└─────────────────────────────────────┘

FIG.3

Write "0"
Stage 1

INTEGRATED CIRCUIT DEVICE

RELATED APPLICATIONS

This patent application claims the benefit of U.S. Provisional Patent Application No. 61/026,705, filed Feb. 6, 2008, which is hereby incorporated by reference herein in its entirety.

This patent application is a continuation of U.S. patent application Ser. No. 12/367,154, filed Feb. 6, 2009, which is hereby incorporated by reference herein in its entirety.

This patent application is related to U.S. patent application Ser. Nos. 11/509,188, filed Aug. 24, 2006, and 12/019,320, filed Jan. 24, 2008, and U.S. Provisional Patent Application No. 60/932,771, filed Jun. 1, 2007, each of which is hereby incorporated by reference herein in its entirety.

TECHNICAL FIELD

The embodiments relate to a semiconductor device, architecture, memory cell, array, and techniques for controlling and/or operating such device, cell, and array. More particularly, in one aspect, the embodiments relate to a dynamic random access memory ("DRAM") cell, array, architecture and device, wherein the memory cell includes an electrically floating body configured or operated to store an electrical charge.

BACKGROUND

There is a continuing trend to employ and/or fabricate advanced integrated circuits using techniques, materials and devices that improve performance, reduce leakage current and enhance overall scaling. Semiconductor-on-Insulator (SOI) is a material in which such devices may be fabricated or disposed on or in (hereinafter collectively "on"). Such devices are known as SOI devices and include, for example, partially depleted (PD) devices, fully depleted (FD) devices, multiple gate devices (for example, double or triple gate), and Fin-FET.

One type of dynamic random access memory cell is based on, among other things, the electrically floating body effect of SOI transistors; see, for example, U.S. Pat. No. 6,969,662 (the "'662 patent"). In this regard, the dynamic random access memory cell may consist of a PD or a FD SOI transistor (or transistor formed in bulk material/substrate) having a channel, which is disposed adjacent to the body and separated from the channel by a gate dielectric. The body region of the transistor is electrically floating in view of the insulation layer (or non-conductive region, for example, in a bulk-type material/substrate) disposed beneath the body region. The state of the memory cell is determined by the concentration of charge within the body region of the SOI transistor.

Data is written into or read from a selected memory cell by applying suitable control signals to a selected word line(s), a selected source line(s) and/or a selected bit line(s). In response, charge carriers are accumulated in or emitted and/or ejected from electrically floating body region wherein the data states are defined by the amount of carriers within electrically floating body region. Notably, the entire contents of the '662 patent, including, for example, the features, attributes, architectures, configurations, materials, techniques and advantages described and illustrated therein, are incorporated by reference herein.

Referring to the operations of an N-channel transistor, for example, the memory cell of a DRAM array operates by accumulating in or emitting/ejecting majority carriers (electrons or holes) from body region. In this regard, conventional write techniques may accumulate majority carriers (in this example, "holes") in body region of memory cells by, for example, impact ionization near source region and/or drain region. In sum, conventional writing programming techniques for memory cells having an N-channel type transistor often provide an excess of majority carriers by impact ionization or by band-to-band tunneling (gate-induced drain leakage ("GIDL")). The majority carriers may be emitted or ejected from body region by, for example, forward biasing the source/body junction and/or the drain/body junction, such that the majority carrier may be removed via drain side hole removal, source side hole removal, or drain and source hole removal, for example.

Notably, for at least the purposes of this discussion, a logic high data state, or logic "1", corresponds to, for example, an increased concentration of majority carries in the body region relative to an unprogrammed device and/or a device that is programmed with logic low data state, or logic "0". In contrast, a logic low data state, or logic "0", corresponds to, for example, a reduced concentration of majority carriers in the body region relative to a device that is programmed with a logic high data state, or logic "1". The terms "logic low data state" and "logic 0" may be used interchangeably herein; likewise, the terms "logic high data state" and "logic 1" may be used interchangeably herein.

In one conventional technique, the memory cell is read by applying a small bias to the drain of the transistor as well as a gate bias which is above the threshold voltage of the transistor. In this regard, in the context of memory cells employing N-type transistors, a positive voltage is applied to one or more word lines to enable the reading of the memory cells associated with such word lines. The amount of drain current is determined or affected by the charge stored in the electrically floating body region of the transistor. As such, conventional reading techniques sense the amount of channel current provided/generated in response to the application of a predetermined voltage on the gate of the transistor of the memory cell to determine the state of the memory cell; a floating body memory cell may have two or more different current states corresponding to two or more different logical states (for example, two different current conditions/states corresponding to the two different logical states: "1" and "0").

Further to writing and reading data to memory cells, data stored in the memory cells is required, under certain circumstances, to be periodically refreshed as a result of leakage current. The refreshing of the memory generally involves periodically reading information or data from an area of the memory (e.g., memory cells), and subsequently rewriting the read information into the same area of memory (e.g., memory cells) from which it was read with no modifications. Conventional refreshing techniques thus use the read and write operations appropriate to the transistor, and perform the read and write during two or more separate clock cycles. The technique used for refreshing data in a dynamic memory can have a large impact on memory performance, including memory availability, die area, and power consumption. Memories are typically and more specifically refreshed by performing a read operation during which data is read from memory cells into sense amps, followed by a write operation during which data is written back into the memory cells.

Conventional solutions to improve memory availability have typically involved increasing the number of sense amps in the memory so more of the memory can be refreshed at the same time. Unfortunately, the addition of more sense amps increases memory die area. Additionally, conventional refresh techniques often lead to relatively large power consumption due to, for example, the separate read and write operations of the refresh. The present inventions, in one aspect, are directed to hold operations that inherently refresh data states of memory cells without the need for separate refresh operations.

INCORPORATION BY REFERENCE

Each patent, patent application, and/or publication mentioned in this specification is herein incorporated by reference in its entirety to the same extent as if each individual patent, patent application, and/or publication was specifically and individually indicated to be incorporated by reference.

BRIEF DESCRIPTION OF THE DRAWINGS

In the course of the detailed description to follow, reference will be made to the attached drawings. These drawings show different aspects of the present inventions and, where appropriate, reference numerals illustrating like structures, components, materials and/or elements in different figures are labeled similarly. It is understood that various combinations of the structures, components, materials and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

FIG. 3 is a flow diagram for a method for continually holding a data state of a memory cell, under an embodiment.

DETAILED DESCRIPTION

There are many inventions described herein as well as many aspects and embodiments of those inventions. In one aspect, the present inventions are directed to a semiconductor device including an electrically floating body. "Electrically floating body" or "floating body" refers to a transistor body which is not coupled to, and is therefore insulated from, power or ground rails within a semiconductor device or integrated circuit (IC) chip. Various levels of charge may therefore accumulate within a floating body of a transistor. Floating-body transistors are a significant characteristic of SOI devices.

In another aspect, the present inventions are directed to techniques to control and/or operate a semiconductor memory cell (and memory cell array having a plurality of such memory cells as well as an integrated circuit device including a memory cell array) having one or more electrically floating body transistors in which an electrical charge is stored in the body region of the electrically floating body transistor. The techniques of the present inventions may employ intrinsic bipolar transistor currents (referred to herein as "source" currents) to control, write, read and/or hold/refresh a data state in such a memory cell. In this regard, the present inventions may employ the intrinsic bipolar source current to control, write, read and/or hold/refresh a data state in/of the electrically floating body transistor of the memory cell.

The present inventions are also directed to semiconductor memory cell, array, circuitry and device to implement such control and operation techniques. Notably, the memory cell and/or memory cell array may comprise a portion of an integrated circuit device, for example, logic device (such as, a microcontroller or microprocessor) or a portion of a memory device (such as, a discrete memory).

Figure 1A:
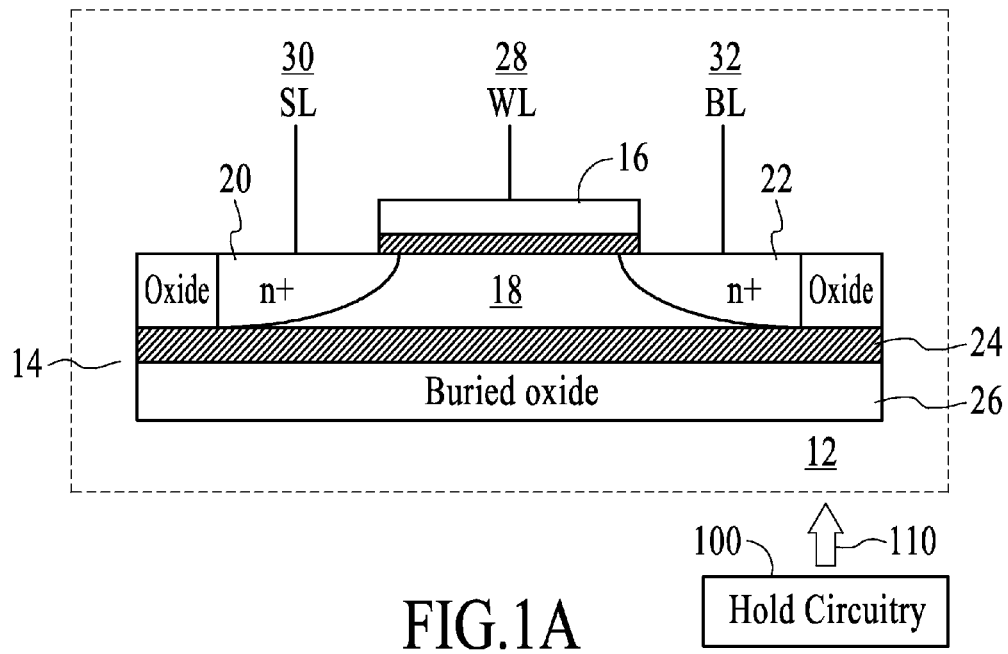
FIG. 1A is a memory cell coupled to hold circuitry that inherently refreshes logic high and logic low data states of the memory cell during hold operations, under an embodiment.

FIG. 1A is a memory cell 12 coupled to hold circuitry 100 that applies hold signals that inherently refresh logic high and logic low data states of the memory cell, under an embodiment. The memory cell 12 is configured at least nearly the same as or representative of numerous other memory cells of a memory array (not shown) to which the memory cell 12 may be coupled. The memory cell 12 includes a transistor 14 having gate 16, body region 18, which is configured to be electrically floating, source region 20 and drain region 22. The body region 18 is disposed between source region 20 and drain region 22. Moreover, body region 18 is disposed on or above region 24, which may be an insulation region (for example, in an SOI material/substrate) or non-conductive region (for example, in a bulk-type material/substrate). The insulation or non-conductive region 24 may be disposed on substrate 26.

Data is written into, read from, or held/refreshed in a state in a selected memory cell 12 by applying suitable control signals to a selected word line(s) 28, a selected source line(s)

30 and/or a selected bit line(s) 32. For example, the gate 16 of a transistor 14 of an embodiment is coupled to a word line 28, the source region 20 is coupled to a source line 30, and the drain region 22 is coupled to a bit line 32. In response to the control signals, charge carriers are accumulated in or emitted and/or ejected from electrically floating body region 18 wherein the data states are defined by the amount of carriers within electrically floating body region 18, as described herein.

Figure 2:
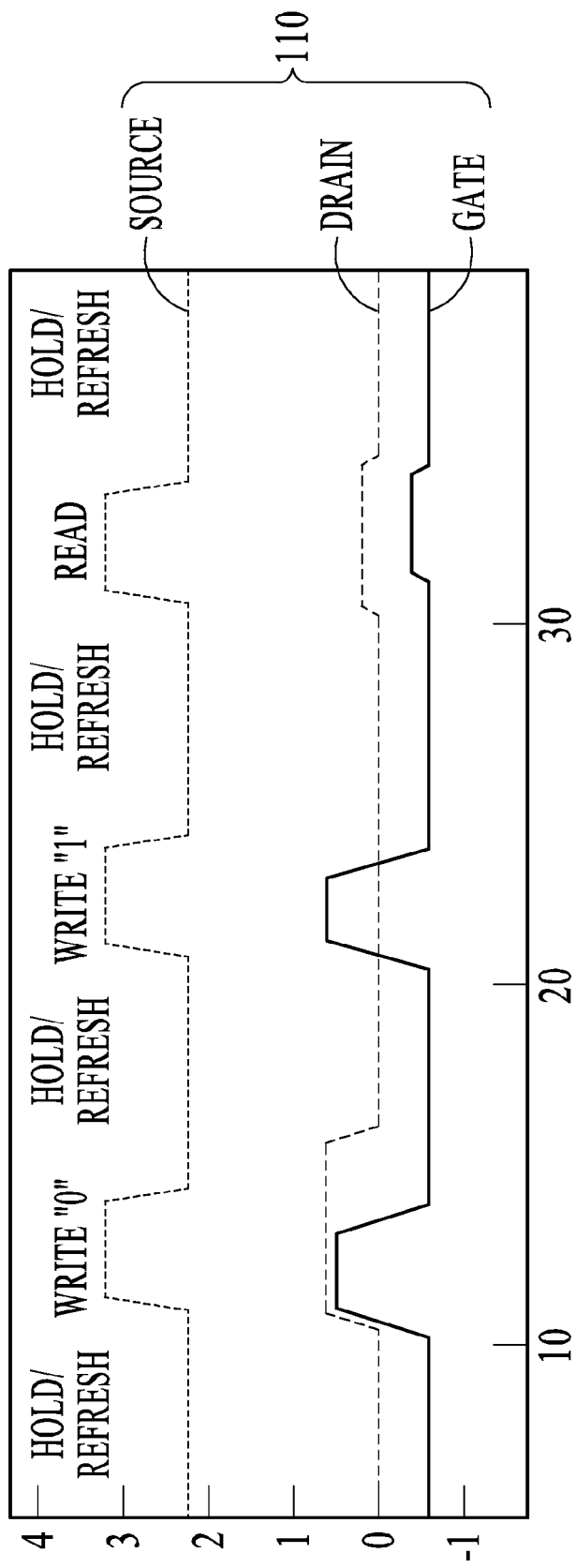
FIG. 2 shows relative magnitudes and timing of hold signal application to a floating-body transistor during hold operations that inherently refresh both logic high and logic low data states of the memory cell during hold operations, under a first embodiment.

The hold circuitry 100 of an embodiment is configured to continually apply to the transistor 14, except during read operations and write operations, control signals that include a set of hold signals 110. FIG. 2 shows relative magnitudes and timing of hold signal 110 application to a floating-body transistor 14 during hold operations, under a first embodiment. The set of hold signals 110 continually hold a data state of the transistor 14 by inherently refreshing the data state written into the transistor 14 during a preceding write operation. The data state held/refreshed by the hold signals 110 includes a logic high data state and a logic low data state. The transistor 14 of an embodiment retains the data state as long as the hold signals 110 are applied.

The set of hold signals 110 of an embodiment include a first potential applied to the gate 16 via word line 28, and a second potential applied between the source region and the drain region. The first potential of an embodiment includes a voltage of approximately −0.7 volts applied to the gate 16 via word line 28. The second potential of an embodiment includes a voltage approximately in a range of 1.5 volts to 3.2 volts applied to source region 20 via the source line 30 while a voltage approximately equal to ground potential is applied to the drain region 22 via the bit line 32. The second potential of a more specific embodiment includes a voltage of approximately 2.3 volts applied to source region 20 via the source line 30 while a voltage approximately equal to ground potential is applied to the drain region 22 via the bit line 32. Application of the second potential between the source 20 and drain 22 regions is simultaneous or nearly simultaneous with application of the first potential to the gate 16.

When the body region 18 of the transistor 14 of an embodiment is in the logic high data state, for example, application of the set of hold signals 110 cause bipolar current to flow in the body region 18. This is because when the body region 18 of the transistor 14 of an embodiment is in the logic high data state, the second potential of the hold signals 110 is greater than a threshold above which bipolar current is generated in the body region 18. More specifically, the potential difference between the source (drain) voltage and the drain (source) voltage is greater than the threshold required to turn on the bipolar transistor. Therefore, source current of the transistor causes or produces impact ionization and/or the avalanche multiplication phenomenon among carriers in the electrically floating body region 18. The impact ionization produces, provides, and/or generates an excess of majority carriers in the electrically floating body region 18 of transistor 14 of memory cell 12 as described above. Thus, the second potential difference causes bipolar current to flow in the body region 18 resulting from the increase of majority carriers in the body region 18 due to impact ionization, as described herein. The bipolar current flow in the body region 18 maintains the logic high data state.

When the body region 18 of the transistor 14 of an embodiment is in the logic low data state, application of the set of hold signals 110 fails to cause bipolar current to flow in the body region. This is because when the body region 18 of the transistor 14 of an embodiment is in the logic low data state, the second potential is less than the threshold, and the flow of bipolar current is absent in the body region 18 when the second potential is below the threshold. More specifically, the potential difference between the source (drain) voltage and the drain (source) voltage is less than the threshold required to turn on transistor 14. Consequently, no impact ionization takes place among carriers in the body region 18 and no bipolar or source current is produced in the electrically floating body region 18. Thus, no excess of majority carriers are generated in the electrically floating body region 18 of transistor 14 of memory cell 12. The absence of excess majority carriers in the body region 18 maintains the logic low data state.

Figure 1B:
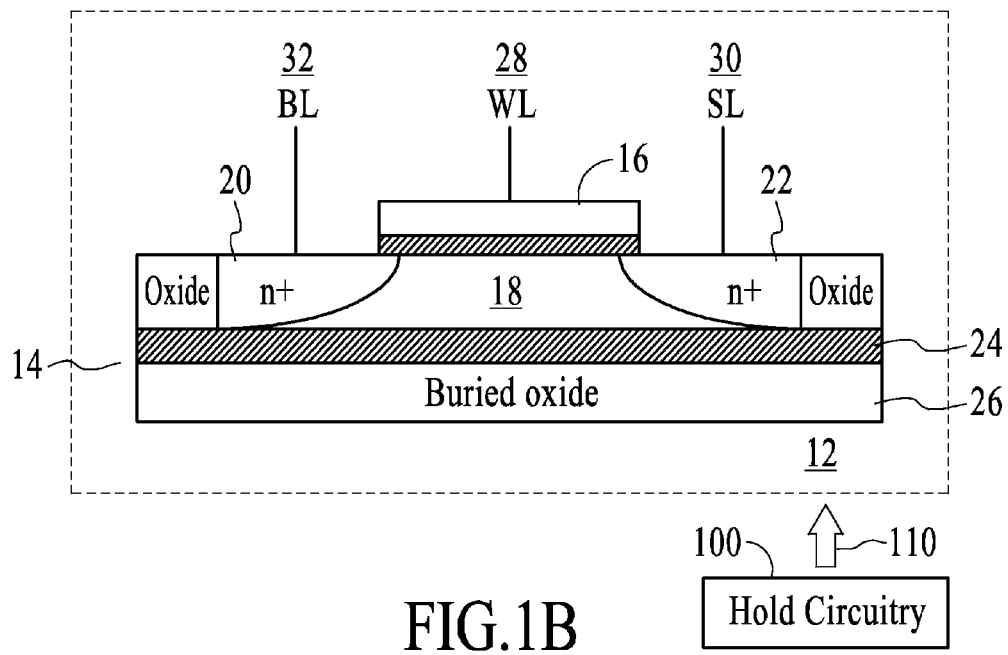
FIG. 1B is a memory cell coupled to hold circuitry that inherently refreshes logic high and logic low data states of the memory cell during hold operations, under an alternative embodiment.

FIG. 1B is a memory cell 12 coupled to hold circuitry 100 that applies hold signals that inherently refresh logic high and logic low data states of the memory cell, under an alternative embodiment. The memory cell 12 includes a transistor 14 having gate 16, body region 18, which is configured to be electrically floating, source region 20 and drain region 22. The body region 18 is disposed between source region 20 and drain region 22. Moreover, body region 18 is disposed on or above region 24, which may be an insulation region (for example, in an SOI material/substrate) or non-conductive region (for example, in a bulk-type material/substrate). The insulation or non-conductive region 24 may be disposed on substrate 26.

Data is written into, read from, or held/refreshed in a state in a selected memory cell 12 by applying suitable control signals to a selected word line(s) 28, a selected source line(s) 30 and/or a selected bit line(s) 32. For example, the gate 16 of a transistor 14 of an embodiment is coupled to a word line 28, the drain region 20 is coupled to a bit line 32, and the source region 22 is coupled to a source line 30. In response to the control signals, charge carriers are accumulated in or emitted and/or ejected from electrically floating body region 18 wherein the data states are defined by the amount of carriers within electrically floating body region 18.

The hold circuitry 100 of an embodiment is configured to continually apply to the transistor 14, except during read operations and write operations, control signals that include a set of hold signals 110. The set of hold signals 110 continually hold a data state of the transistor 14 by inherently refreshing the data state written into the transistor 14 during a preceding write operation. The data state includes a logic high data state and a logic low data state. The transistor 14 of an embodiment retains the data state as long as the hold signals 110 are applied.

The set of hold signals 110 of an embodiment include a first potential applied to the gate 16 via word line 28, and a second potential applied between the source region and the drain region. The first potential of an embodiment includes a voltage of approximately −0.7 volts applied to the gate 16 via word line 28. The second potential of an embodiment includes a voltage approximately in a range of 1.5 volts to 3.2 volts applied to drain region 20 via the bit line 32 while a voltage approximately equal to ground potential is applied to the source region 22 via the source line 30. The second potential of a more specific embodiment includes a voltage of approximately 2.3 volts applied to drain region 20 via the bit line 32 while a voltage approximately equal to ground potential is applied to the source region 22 via the source line 30. Application of the second potential between the source 22 and drain 20 regions is simultaneous or nearly simultaneous with application of the first potential to the gate 16.

FIG. 2 shows relative magnitudes and timing of hold signal application to a floating-body transistor 14 during hold operations, under a first embodiment. The timing and magnitude of these signals are shown as examples only and are not intended to limit the embodiments described herein to the timing and magnitude shown in this figure. The hold signals are applied to the transistor 14 of memory cell 12 during periods outside of write operations and read operations, but the embodiment is not so limited. The refresh of data state inherent in the hold operations of an embodiment generally saves time and has relatively lower power consumption when compared to conventional refresh operations. The faster speed and lower power consumption result from the fact that the voltages applied to the source and gate of the transistor during hold operations or cycles of an embodiment inherently refresh all transistor data states, thereby eliminating the need for read and write operations of conventional refresh operations. Thus power consumption is reduced because read and write operations associated with refreshing the memory cells are eliminated as are the clock cycles dedicated to refreshing memory cells.

Higher memory availability also results from the hold operation of an embodiment because refreshing of data states inherent in the hold operation eliminates the requirement for clock cycles dedicated to refresh operations. Furthermore, sense amps are not required for refresh operations.

The voltage levels described herein to implement the hold operations are merely examples of control signals. Indeed, the indicated voltage levels may be relative or absolute. Alternatively, the voltages indicated may be relative in that each voltage level, for example, may be increased or decreased by a given voltage amount (for example, each of the gate, source, and drain voltage may be increased or decreased by 0.5, 1.0 and 2.0 volts) whether one or more of the voltages (for example, the source, drain or gate voltages) become or are positive and negative.

FIG. 3 is a flow diagram 300 for a method for continually holding a data state of a memory cell, the memory cell consisting essentially of a transistor configured to include a floating body, under an embodiment. Holding operations include continually applying, except during read operations and write operations, a first potential 302 to a gate of the transistor. The hold operations include continually applying a second potential 304 across a source region and a drain region of the transistor except during read operations and write operations. The first potential and the second potential continually hold a data state previously written to the memory cell by inherently refreshing both logic high data states and logic low data states.

As described above, the memory cell of an embodiment consists essentially of a transistor configured to include a floating body. The method of an embodiment comprises continually applying a set of hold signals to the memory cell except during read operations and write operations. The set of hold signals of an embodiment hold a data state of the memory cell by inherently refreshing the data state. The data state of an embodiment includes a logic high data state and a logic low data state. The hold signals of an embodiment cause the transistor to retain the data state as long as the hold signals are applied.

Applying the set of hold signals comprises applying a first potential to a gate of the transistor and applying a second potential between a source region and a drain region of the transistor. Application of the second potential between the source and drain regions is simultaneous or nearly simultaneous with application of the first potential to the transistor gate.

The first potential of an embodiment includes a voltage of approximately −0.7 volts, and the second potential of an embodiment includes a voltage approximately in a range of 2.2 volts to 2.6 volts. The second potential of a more specific embodiment includes a voltage of approximately 2.3 volts.

The body region of the transistor of an embodiment functions as an inherent bipolar transistor. Consequently, when the floating body of the transistor of an embodiment is in the logic high data state, the second potential of the hold signals is greater than a threshold above which bipolar current is generated in the floating body and the second potential difference causes bipolar current to flow in the floating body resulting from the increase of majority carriers in the floating body due to impact ionization. This bipolar current serves to keep the logic high data state refreshed.

Similarly, when the floating body of the transistor of an embodiment is in the logic low data state, the second potential of the hold signals is less than the threshold, wherein the flow of bipolar current is absent in the floating body. The absence of bipolar current functions to keep the logic low data state refreshed.

The memory cell 12 of an embodiment generally operates by accumulating in or emitting/ejecting majority carriers (electrons or holes) from body region 18. In this regard, write operations or techniques may accumulate majority carriers (e.g., "holes") in body region 18 of memory cell transistors by, for example, impact ionization near drain region 20 and/or source region 22, as described in detail herein. During read operations, the majority carriers may be emitted or ejected from body region 18 by, for example, forward biasing the source/body junction and/or the drain/body junction as described in detail herein.

Writing data into a selected memory cell 12 of an embodiment includes applying suitable control signals to a selected word line(s) 28, a selected source line(s) 30 and/or a selected bit line(s) 32, as described herein. As a result of the body region 18 being electrically insulated from the underlying substrate 26 by an insulating layer 24, the control signals result in data being written to the transistor in the form of charge stored in the body region 18. The stored charge may be referred to as "body charge" but is not so limited.

The configuration of the memory cell 12 described herein, which comprises essentially one transistor, is in contrast to body-contacted dynamic random access memory (BCDRAM) cells that include multiple transistors per cell. For example, each BCDRAM cell includes, in addition to a storage transistor, one or more access transistors contacted to a contact of the body region of the storage transistor. The numerous transistors included in the configuration of a BCDRAM cell (an example of which is provided in U.S. Pat. No. 6,111,778) thus makes write and/or read operations different from those described herein for use in the operation of memory cell 12.

Data is read from a memory cell 12 of an embodiment by generally applying suitable control signals to a selected word line(s) 28, a selected source line(s) 30 and/or a selected bit line(s) 32 that cause the body-to-source junction (PN junction) to become forward biased or not depending on data state. This condition precipitates an inherent bipolar current. The total charge of the bipolar current has a magnitude proportional to the charge accumulated on the body region 18 of the transistor multiplied by the current gain (beta value) of the inherent bipolar transistor. The inherent bipolar current is a distorted pulse waveform of relatively short duration. In this manner the effective value of capacitance, in terms of the magnitude of discharge current sensed at a bit line (FIG. 1A-1B, element 32), is enhanced by this parasitic bipolar effect.

Figure 4A:
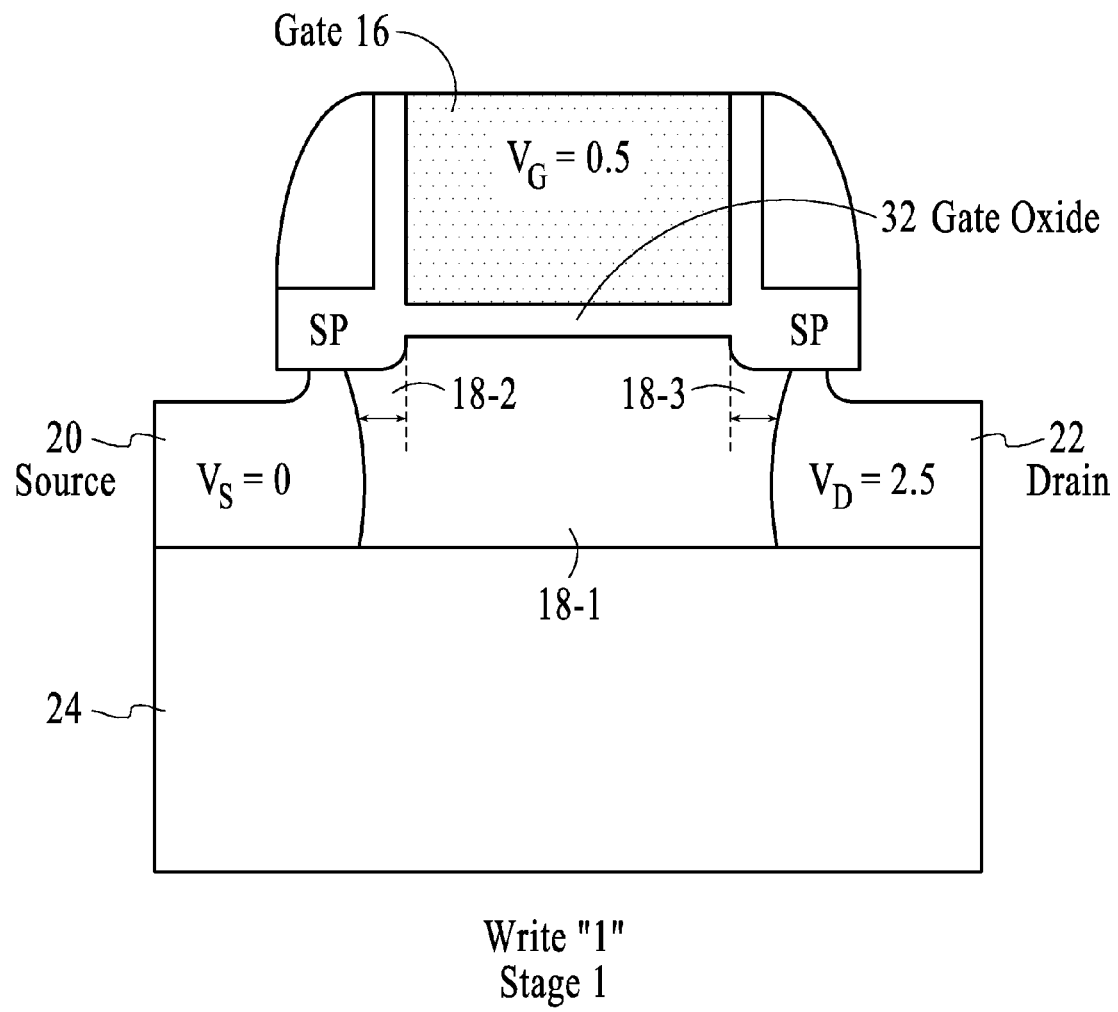
FIGS. 4A and 4B show various stages of operation of transistor when writing or programming logic "1", under an embodiment.
Figure 4B:
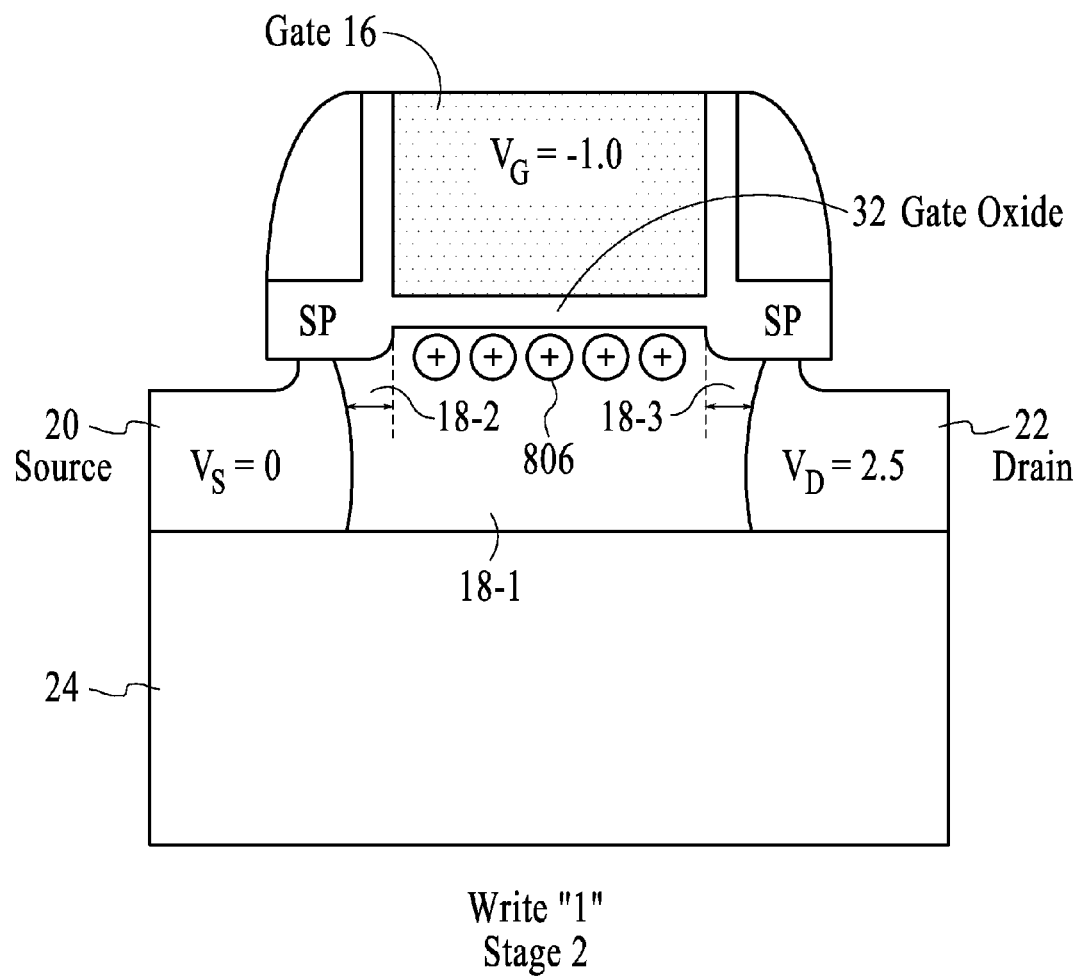

Read and write operations are used to program and read the transistor as described herein. FIGS. 4A and 4B show operation of transistor 14 when writing or programming a logic "1", under an embodiment. The transistor 14 of this embodiment is an N-channel or nMOS FET, but is not so limited; transistor 14 may be a P-channel or pMOS FET in an alternative embodiment. The N-channel device includes source 20 and drain 22 regions comprising N+-type material while the body region 18 comprises a P-type material.

As a general example for use with floating-body transistors, a logic "1" programming operation of an embodiment includes a two stage control signal application during which the gate voltage is changed from a first voltage level to a second voltage level. In operation, when writing or programming logic "1", in one embodiment, control signals having predetermined voltages (e.g., Vg=0.5 v, Vs=0 v, and Vd=2.5 v) are initially applied during stage one to gate 16, source region 20 and drain region 22 (respectively) of transistor 14 of memory cell 12 (FIG. 4A). The stage one control signals may result in an accumulation of majority carriers (not shown) in the electrically floating body 18. As a result of the polarity (e.g., positive) of the control signal applied to the gate with the stage one control signals, any majority carriers that happen to be present in the body region 18 accumulate in the first portion 18-1 of the body 18. The majority carriers may accumulate in an area of the first portion 18-1 under the gate, but are not so limited.

Furthermore, even if an inversion channel were to form in the first portion 18-1 of the body region as a result of the gate voltage, the inversion channel would not form in the second 18-2 and third 18-3 portions of the body region because these regions 18-2/18-3 are not under the gate. Therefore, any inversion channel formed under the embodiments described herein would be "disconnected" from or discontinuous with the source 20 and drain 22 regions.

The stage one control signals also generate or provide a source current in electrically floating body region 18 of transistor 14. More specifically, the potential difference between the source voltage and the drain voltage (e.g., 2.5 volts) is greater than the threshold required to turn on the bipolar transistor. Therefore, source current of the transistor causes or produces impact ionization and/or the avalanche multiplication phenomenon among carriers in the electrically floating body region 18. The impact ionization produces, provides, and/or generates an excess of majority carriers 806 (FIG. 4B) in the electrically floating body region 18 of transistor 14 of memory cell 12 as described above.

Notably, it is preferred that the source current responsible for impact ionization and/or avalanche multiplication in electrically floating body region 18 is initiated or induced by the control signal applied to gate 16 of transistor 14 along with the potential difference between the source 20 and drain 22 regions. Such a control signal may induce channel impact ionization which raises or increases the potential of body region 18 and "turns on", produces, causes and/or induces a source current in transistor 14. One advantage of the proposed writing/programming technique is that a large amount of the excess majority carriers 806 may be generated and stored in electrically floating body region 18 of transistor 14.

Figure 5A:
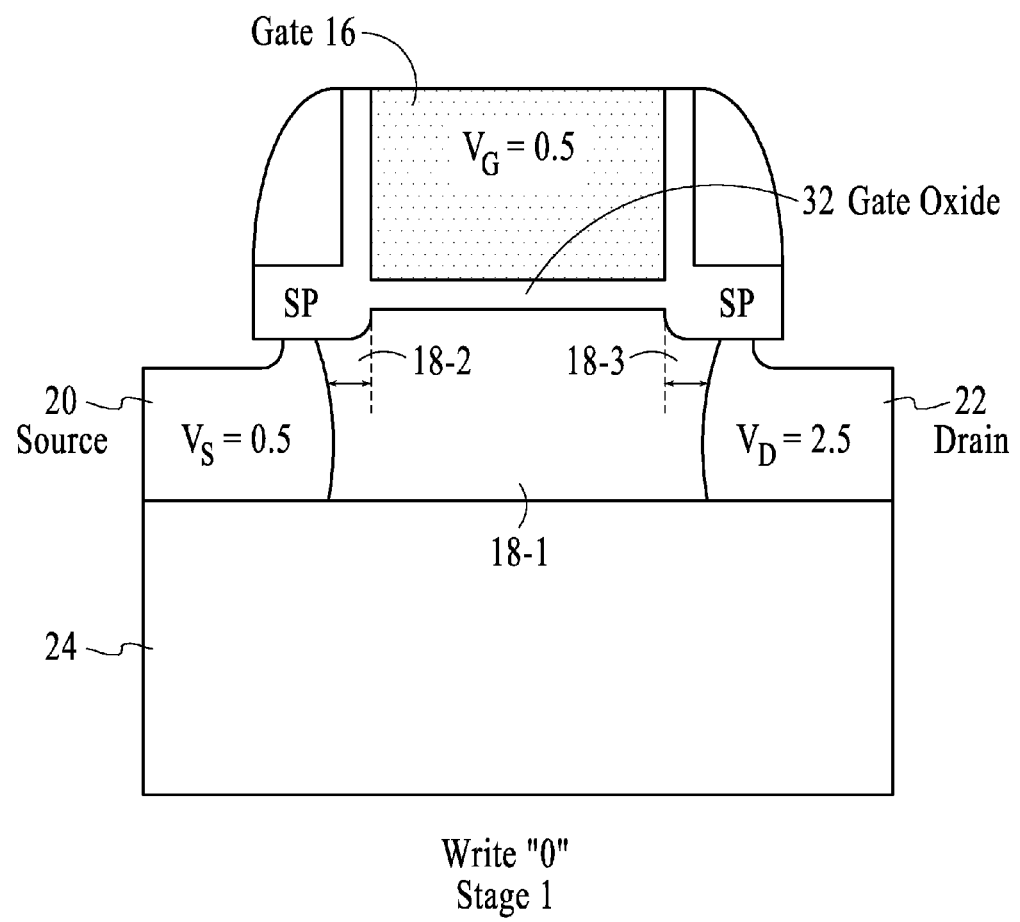
FIGS. 5A and 5B show various stages of operation of transistor when writing or programming logic "0", under an embodiment.
Figure 5B:
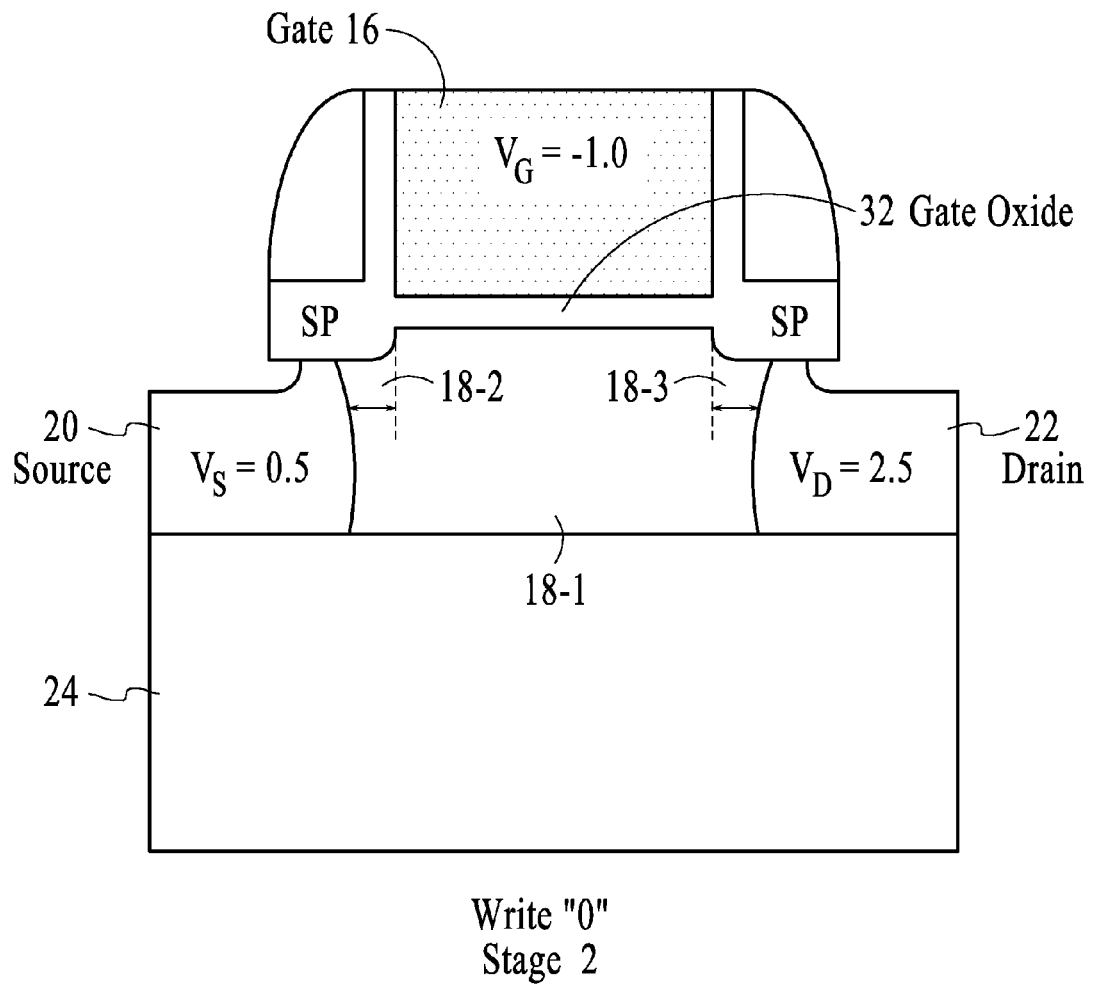

The stage two control signals are subsequently applied to the transistor when writing or programming logic "1" as described above. The stage two control signals are control signals having predetermined voltages (for example, Vg=−1.0 v, Vs=0 v, and Vd=2.5 v) applied to gate 16, source region 20 and drain region 22 (respectively) of transistor 14 of memory cell 12 (FIG. 4B) subsequent to stage one. As a result of the polarity (e.g., negative) of the control signal applied to the gate with the stage two control signals, the majority carriers 806 of the body region 18 accumulate near the surface of the first portion 18-1 of the body region (FIG. 4B). The polarity of the gate signal (e.g., negative) combined with the floating body causes the majority carriers 806 to become trapped or "stored" near the surface of the first portion 18-1 of the body region. In this manner the body region 18 of the transistor "stores" charge (e.g., equivalently, functions like a capacitor). Thus, in this embodiment, the predetermined voltages of the stage one and stage two control signals program or write logic "1" in memory cell 12 via impact ionization and/or avalanche multiplication in electrically floating body region 18. The FIGS. 5A and 5B show operation of transistor 14 when writing or programming logic "0", under an embodiment. As a general example for use with floating-body transistors, a logic "0" programming operation of an embodiment includes a two stage control signal application during which the gate voltage is changed from a first voltage level to a second voltage level. In operation, when writing or programming logic "0", in one embodiment, control signals having predetermined voltages (for example, Vg=0.5 v, Vs=0.5 v, and Vd=2.5 v) are initially applied during stage one to gate 16, source region 20 and drain region 22 (respectively) of transistor 14 of memory cell 12 (FIG. 5A). The stage one control signals may result in an accumulation of minority carriers (not shown) in the electrically floating body 18. More specifically, as a result of the polarity (e.g., positive) of the control signal applied to the gate with the stage one control signals, any accumulation of minority carriers occurs under the gate 16 in the first portion 18-1 of the body region, in an area that is close to the interface between gate dielectric 32 and electrically floating body 18 as described above. Any minority carriers that accumulate are in the first portion 18-1 of the body region as a result of the gate voltage, and thus do not accumulate in the second 18-2 and third 18-3 portions of the body region. Therefore, the accumulated charge of the body region 18 is discontinuous with the source 20 and drain 22 regions.

The potential difference between the source voltage and the drain voltage (e.g., 2.0 volts) of the stage one control signals, however, is less than the threshold required to turn on transistor 14. Consequently, no impact ionization takes place among carriers in the body region 18 and no bipolar or source current is produced in the electrically floating body region 18. Thus, no excess of majority carriers are generated in the electrically floating body region 18 of transistor 14 of memory cell 12.

The stage two control signals are subsequently applied to the transistor 14 when writing or programming logic "0" as described above. The stage two control signals are control signals having predetermined voltages (for example, Vg=−1.0 v, Vs=0.5 v, and Vd=2.5 v) applied to gate 16, source region 20 and drain region 22 (respectively) of transistor 14 of memory cell 12 (FIG. 5B) subsequent to stage one. The polarity (e.g., negative) of the gate signal may result in any minority carriers that accumulate being removed from electrically floating body region 18 of transistor 14 via one or more of the source region 20 and the drain region 22. Furthermore, the polarity of the gate signal (e.g., negative) causes any minority carriers remaining in the body region 18 to be trapped or "stored" near the surface of the first portion of the body region 18. The result is an absence of excess majority carriers in the body region 18 so that, in this manner, the predetermined voltages of the stage one and stage two control signals program or write logic "0" in memory cell 12.

A logic "0" programming operation of an alternative embodiment includes a two stage control signal application during which the gate voltage is changed from a first voltage level to a second voltage level. In operation, when writing or programming logic "0", in this alternative embodiment, control signals having predetermined voltages (for example, Vg=0 v, Vs=0 v, and Vd=0 v) are initially applied during stage one to gate 16, source region 20 and drain region 22 (respectively) of transistor 14 of memory cell 12.

The voltage levels described here as control signals to implement the write operations are provided merely as examples, and the embodiments described herein are not limited to these voltage levels. The control signals increase the potential of electrically floating body region 18 which "turns on", produces, causes and/or induces a source current in the transistor of the memory cell. In the context of a write operation, the source current generates majority carriers in the electrically floating body region which are then stored. In the context of a read operation, the data state may be determined primarily by, sensed substantially using and/or based substantially on the source current that is responsive to the read control signals, as described above, and significantly less by the interface channel current component, which is less significant and/or negligible relative to the bipolar component.

Accordingly, the voltage levels to implement the write operations are merely examples of control signals. Indeed, the indicated voltage levels may be relative or absolute. Alternatively, the voltages indicated may be relative in that each voltage level, for example, may be increased or decreased by a given voltage amount (for example, each of the gate, source, and drain voltage may be increased or decreased by 0.5, 1.0 and 2.0 volts) whether one or more of the voltages (for example, the source, drain or gate voltages) become or are positive and negative.

Figure 6:
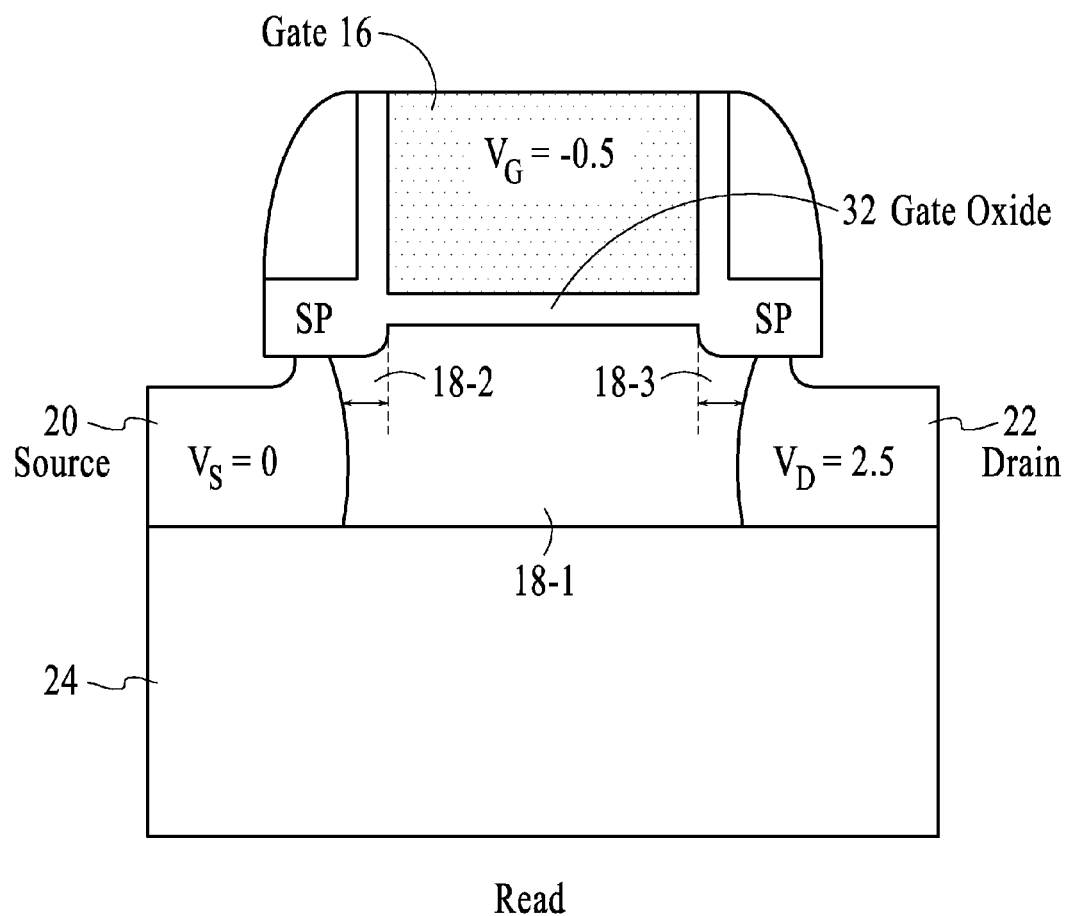
FIG. 6 is an example of an operation under which the data state of a memory cell may be read and/or determined by applying control signals having predetermined voltages to gate and source region and drain region of transistor, under an embodiment.

With reference to FIG. 6, and as a general example for use with floating-body transistors of an embodiment, the data state of memory cell 12 may be read and/or determined by applying control signals having predetermined voltages to gate 16 and source region 20 and drain region 22 of transistor 14 (for example, Vg=−0.5 v, Vs=2.5 v and Vd=0 v, respectively). Such control signals, in combination, induce and/or cause a source current in memory cells 12 that are programmed to logic "1" as described above. As such, sensing circuitry (for example, a cross-coupled sense amplifier), which is coupled to transistor 14 (for example, drain region 22) of memory cell 12, senses the data state using primarily and/or based substantially on the source current. Notably, for those memory cells 12 that are programmed to logic "0", such control signals induce, cause and/or produce little to no source current (for example, a considerable, substantial or sufficiently measurable source current).

Thus, in response to read control signals, electrically floating body transistor 14 generates a source current which is representative of the data state of memory cell 12. Where the data state is logic high or logic "1", electrically floating body transistor 14 provides a substantially greater source current than where the data state is logic low or logic "0". Electrically floating body transistor 14 may provide little to no source current when the data state is logic low or logic "0". As discussed in more detail below, data sensing circuitry determines the data state of the memory cell based substantially on the source current induced, caused and/or produced in response to the read control signals.

The voltage levels described here as control signals to implement the read operations are provided merely as examples, and the embodiments described herein are not limited to these voltage levels. The indicated voltage levels may be relative or absolute. Alternatively, the voltages indicated may be relative in that each voltage level, for example, may be increased or decreased by a given voltage amount (for example, each voltage may be increased or decreased by 0.5, 1.0 and 2.0 volts) whether one or more of the voltages (for example, the source, drain or gate voltages) become or are positive and negative.

Figure 7A:
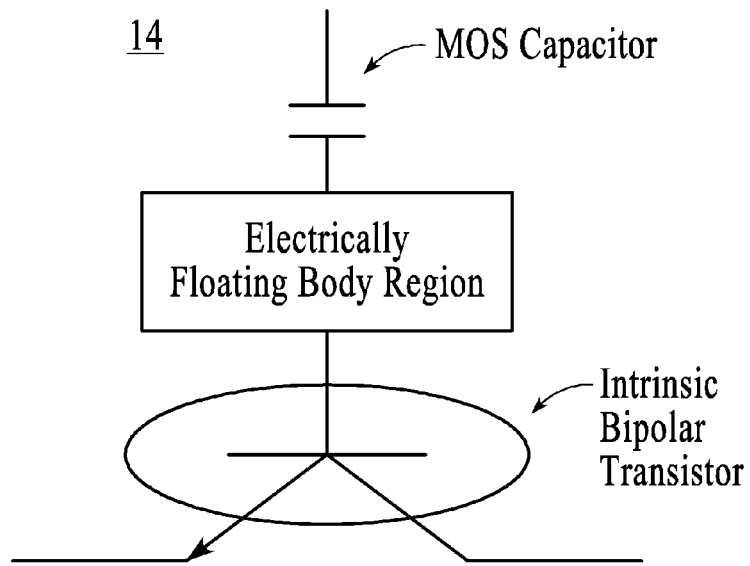
FIG. 7A shows electrically floating body transistor schematically illustrated as including a MOS capacitor "component" and an intrinsic bipolar transistor "component", under an embodiment.

FIG. 7A shows electrically floating body transistor 14 schematically illustrated as including a MOS capacitor "component" and an intrinsic bipolar transistor "component", under an embodiment. In one aspect, the present inventions employ the intrinsic bipolar transistor "component" to program/write as well as read memory cell 12. In this regard, the intrinsic bipolar transistor generates and/or produces a source or bipolar transistor current which is employed to program/write the data state in memory cell 12 and read the data state of memory cell 12. Notably, in this example embodiment, electrically floating body transistor 14 is an N-channel device. As such, majority carriers 34 are "holes".

The bipolar transistor 14 of an embodiment has a floating body, meaning the potential is not fixed or "floating". The potential for example depends on the charge at the gate. A conventional bipolar transistor requires each of base current, emitter current, and collector current for proper operation. Any base of the transistor 14 in this embodiment, however, is floating and not fixed because there is no base contact as found in conventional bipolar FETs; the current in this transistor is therefore referred to herein as a "source" current produced by impact ionization in the body region as described below.

Figure 7B:
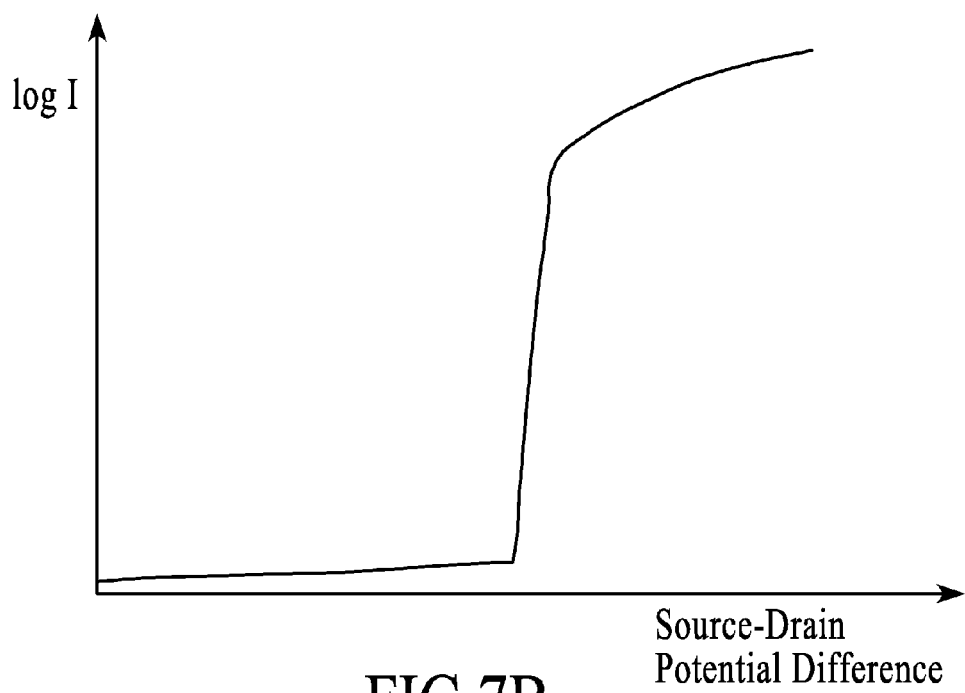
FIG. 7B is an example characteristic curve of electrically floating body transistor, under an embodiment.

FIG. 7B is an example characteristic curve of electrically floating body transistor 14, under an embodiment. The characteristic curve shows a significant increase in source current (e.g., "log I") at and above a specific threshold value of the potential difference between applied source voltage and applied drain voltage ("source-drain potential difference"). The reason for this is that a voltage differential at or above a certain threshold generates a high electric field in the body region. The high electric field results in impact ionization in the first portion 18-1 of the body region 18, a process during which electrons or particles with enough energy generate majority carriers i.e. holes. The impact ionization drives majority carriers to the body region, which increases the body potential, while any minority carriers flow to the drain (or source) region. The increased body potential results in an increase in source current in the body region; thus, the excess majority carriers of the body region generate source current of transistor 14 of an embodiment.

Figure 8:
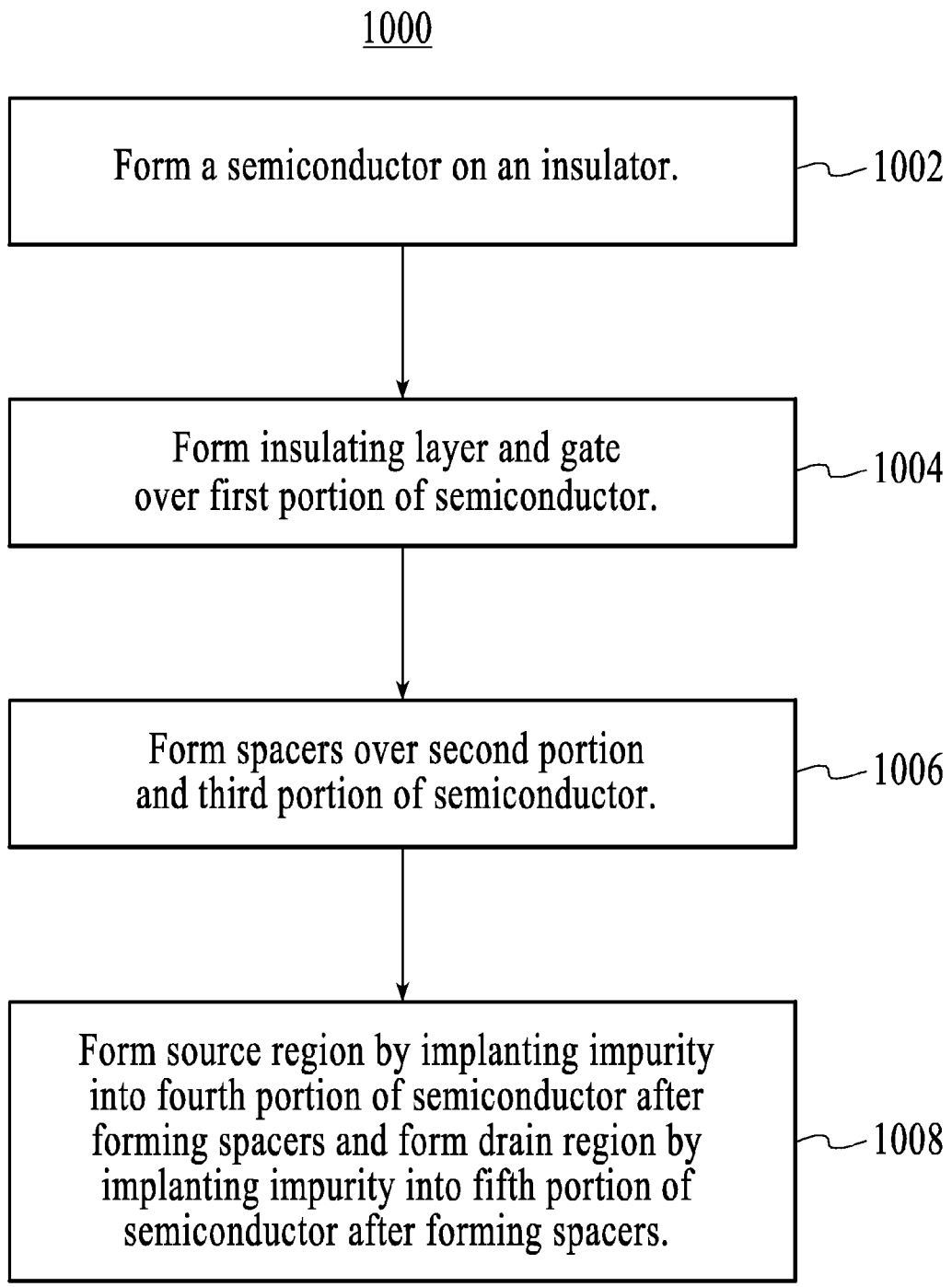
FIG. 8 is a flow diagram for forming a transistor, under an embodiment.

FIG. 8 is a flow diagram for forming transistor 14, under an embodiment. Transistor 14 is formed, generally, by forming 1002 a semiconductor on an insulator. An insulating layer and a gate is formed 1004 over a first portion of the semiconductor. Spacers are formed 1006 over a second portion and a third portion of the semiconductor, and the spacers adjoin the insulating layer. The first portion, second portion, and third portion of the semiconductor collectively form the floating body region. Formation of transistor 14 continues by forming 1008 a source region through implantation of an impurity into a fourth portion of the semiconductor after forming the spacers. The fourth portion of the semiconductor is adjacent the second portion. A drain region is also formed 1008 by implanting the impurity into a fifth portion of the semiconductor after forming the spacers. The fifth portion of the semiconductor is adjacent the third portion.

As mentioned above, the embodiments described herein may be implemented in an IC device (for example, a discrete memory device or a device having embedded memory) including a memory array having a plurality of memory cells arranged in a plurality of rows and columns wherein each memory cell includes an electrically floating body transistor. The memory arrays may comprise N-channel, P-channel and/or both types of transistors. Indeed, circuitry that is peripheral to the memory array (for example, data sense circuitry (for example, sense amplifiers or comparators), memory cell selection and control circuitry (for example, word line and/or source line drivers), as well as row and column address decoders) may include P-channel and/or N-channel type transistors.

Figure 9A:
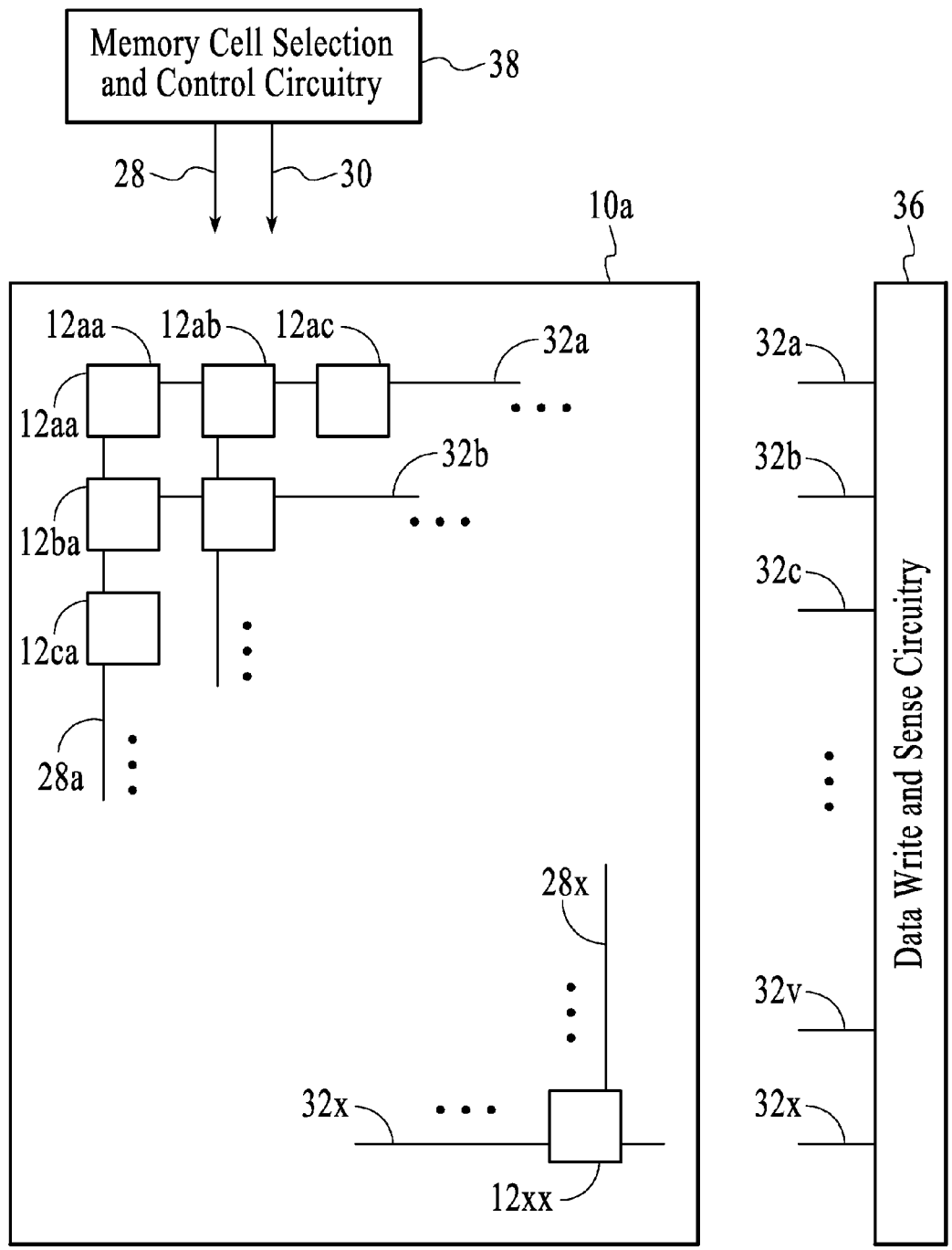
FIGS. 9A and 9B are schematic block diagrams of embodiments of an integrated circuit device including, among other things, a memory cell array, data sense and write circuitry, memory cell selection and control circuitry, according certain aspects of the present inventions.
Figure 9B:
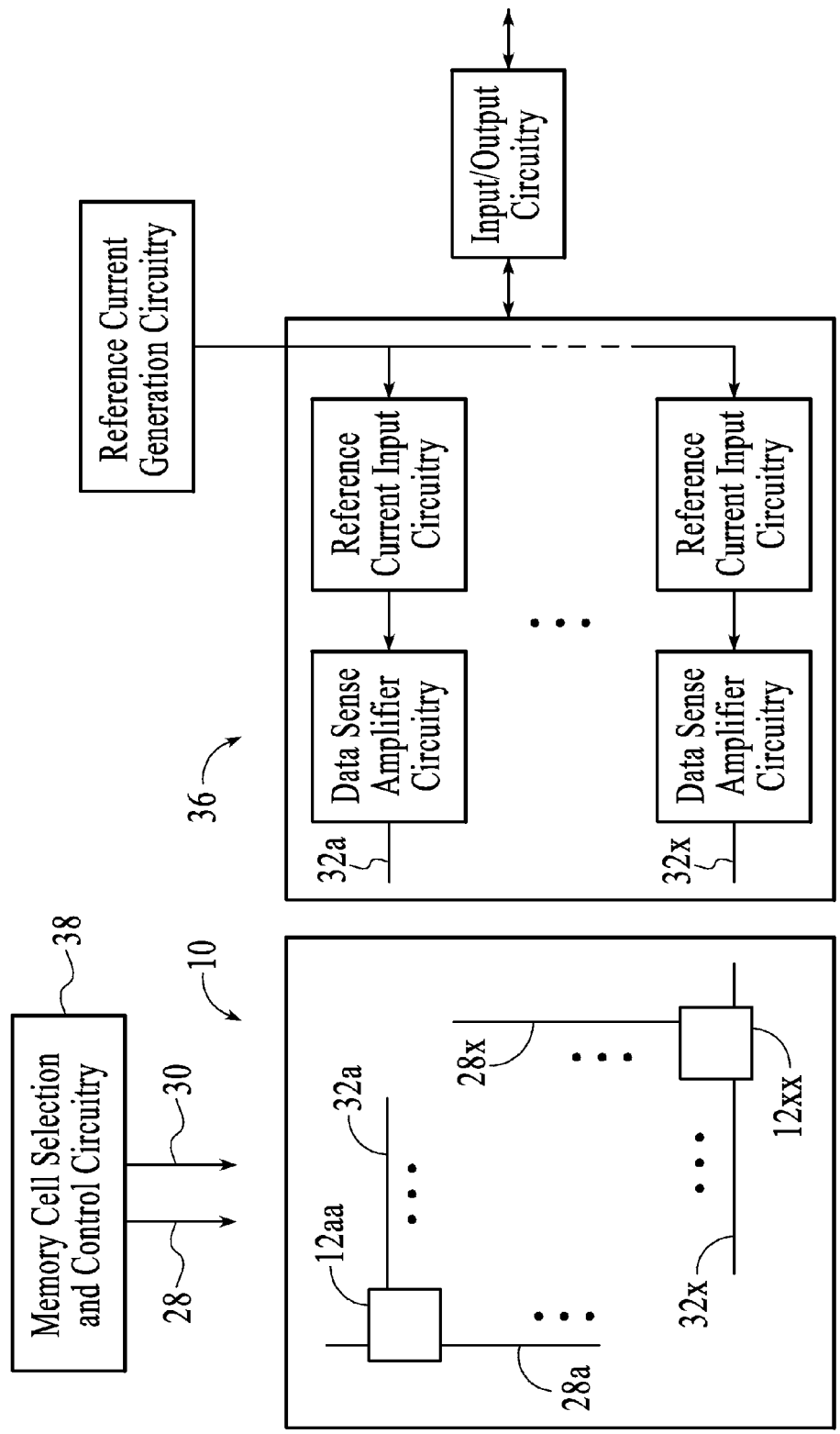

For example, with reference to FIGS. 9A and 9B, the integrated circuit device may include array 10, having a plurality of memory cells 12, data write and sense circuitry 36, and memory cell selection and control circuitry 38. The data write and sense circuitry 36 reads data from and writes data to selected memory cells 12. In one embodiment, data write and sense circuitry 36 includes one or more data sense amplifiers. Each data sense amplifier receives at least one bit line 32 and an output of reference generator circuitry (for example, a current or voltage reference signal). In one embodiment, the data sense amplifier may be a cross-coupled type sense amplifier as described and illustrated in the Non-Provisional U.S. patent application Ser. No. 11/299,590 (U.S. Patent Application Publication US 2006/0126374), filed by Waller and Carman, on Dec. 12, 2005, and entitled "Sense Amplifier Circuitry and Architecture to Write Data into and/or Read Data from Memory Cells", the application being incorporated herein by reference in its entirety) to sense the data state stored in memory cell 12 and/or write-back data into memory cell 12.

The data sense amplifier may employ voltage and/or current sensing circuitry and/or techniques. In the context of current sensing, a current sense amplifier may compare the current from the selected memory cell to a reference current, for example, the current of one or more reference cells. From that comparison, it may be determined whether memory cell 12 contained logic high (relatively more majority carries 34 contained within body region 18) or logic low data state (relatively less majority carries 28 contained within body region 18). Notably, the present inventions may employ any type or form of data write and sense circuitry 36 (including one or more sense amplifiers, using voltage or current sensing techniques, to sense the data state stored in memory cell 12) to read the data stored in memory cells 12, write data in memory cells 12 and/or hold/refresh the data stored in memory cells 12.

The integrated circuit device can include hold circuitry 100 as described above with reference to FIGS. 1-3. However, in alternative embodiments, functions of the data write and sense circuitry 36 can include functions of the hold circuitry described above, wherein the data write and sense circuitry 36 of an embodiment applies hold signals to the memory cell transistors as described above.

Memory cell selection and control circuitry 38 selects and/or enables one or more predetermined memory cells 12 to facilitate reading data from, writing data to and/or holding/refreshing data in the memory cells 12 by applying a control signal on one or more word lines 28. The memory cell selection and control circuitry 38 may generate such control signals using address data, for example, row address data. Indeed, memory cell selection and control circuitry 38 may include a conventional word line decoder and/or driver. There are many different control/selection techniques (and circuitry) to implement the memory cell selection technique. Such techniques, and circuitry, are well known to those skilled in the art. All such control/selection techniques, and circuitry, whether now known or later developed, are intended to fall within the scope of the present embodiments.

In alternative embodiments, functions of the memory cell selection and control circuitry 38 can include functions of the hold circuitry described above, wherein the memory cell selection and control circuitry 38 of an embodiment applies hold signals to the memory cell transistors as described above.

The present inventions may be implemented in any architecture, layout, and/or configuration comprising memory cells having electrically floating body transistors. For example, in one embodiment, memory array 10 including a plurality of memory cells 12 having a separate source line for each row of memory cells (a row of memory cells includes a common word line connected to the gates of each memory cell of the row). The memory array 10 may employ one or more of the example programming, reading, and/or holding/refreshing techniques described above.

In one embodiment, the present inventions are implemented in conjunction with a two step write operation whereby all the memory cells of a given row are written to a predetermined data state by first executing a "clear" operation, whereby all of the memory cells of the given row are written or programmed to logic "0", and thereafter selective memory cells of the row are selectively write operation to the predetermined data state (here logic "1"). The present inventions may also be implemented in conjunction with a one step write operation whereby selective memory cells of the selected row are selectively written or programmed to either logic "1" or logic "0" without first implementing a "clear" operation.

Figure 10:
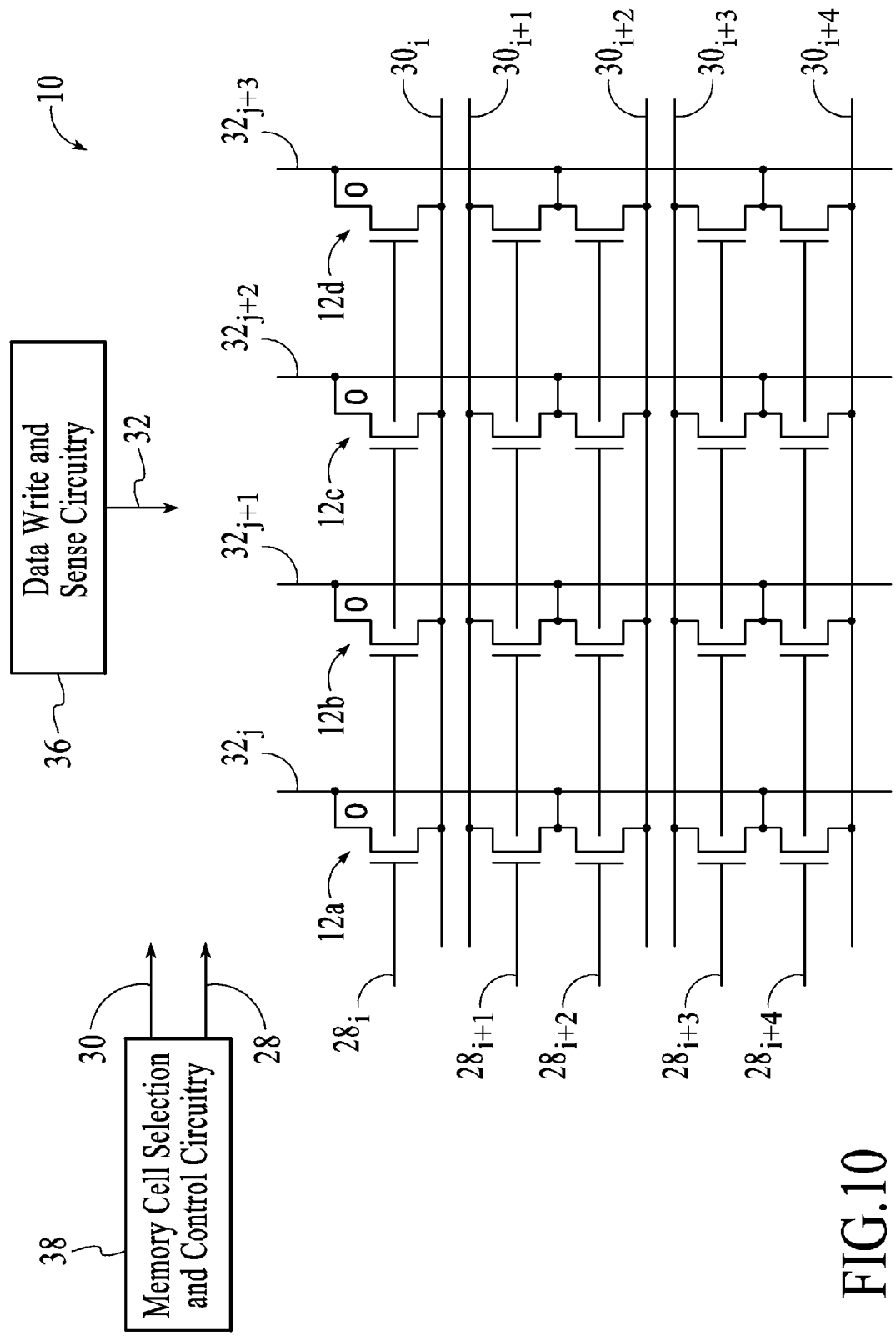
FIGS. 10, 11, and 12 illustrate an embodiment of an exemplary memory array having a plurality of memory cells and employing a separate source line configuration for each row of memory cells, according to certain aspects of the present inventions.
Figure 11:
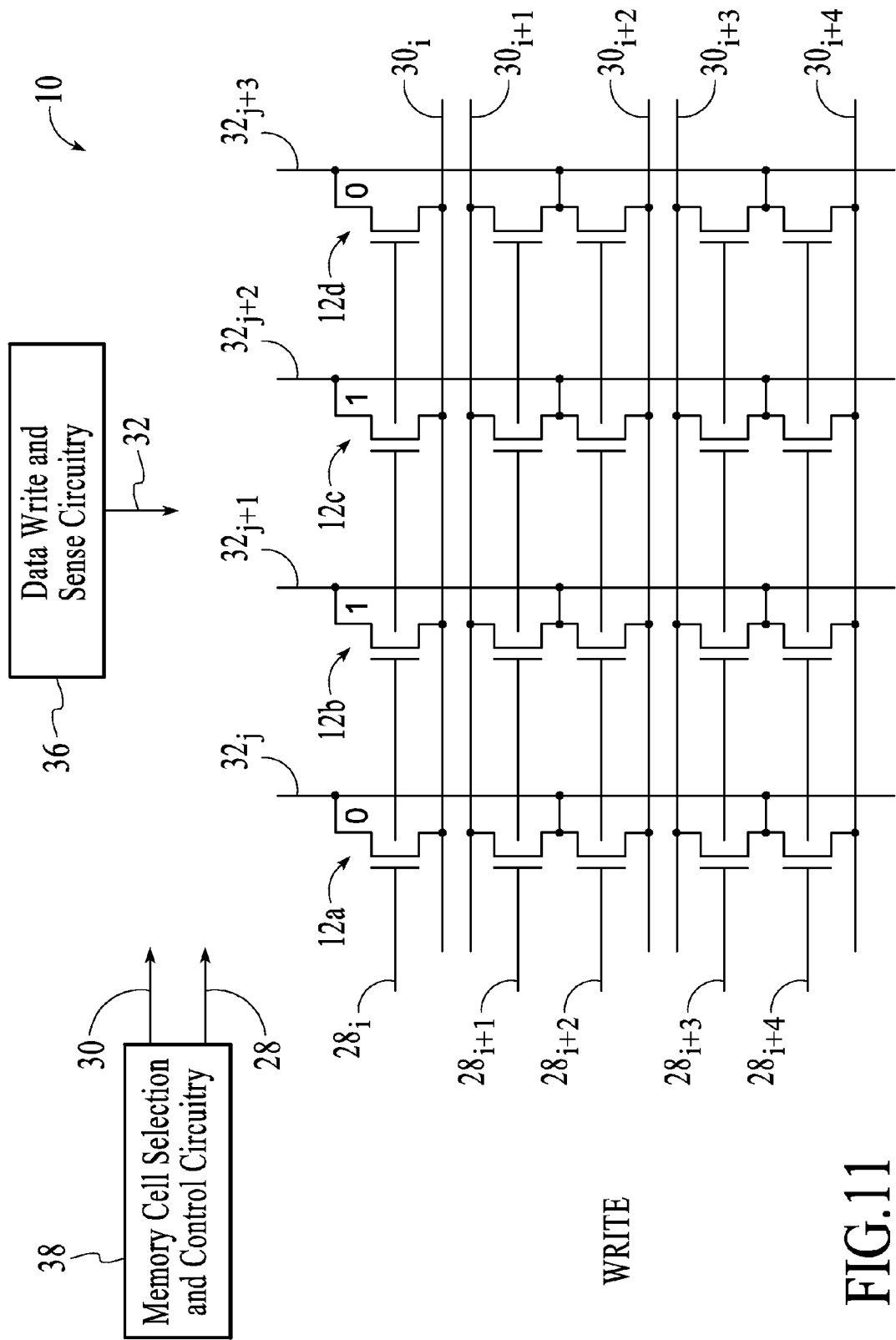

With reference to FIGS. 10 and 11, memory cells 12 may be programmed using the two step operation wherein a given row of memory cells are written to a first predetermined data state by first executing a "clear" operation (which, in this example embodiment, all of the memory cells of the given row are written or programmed to logic "0") and thereafter selected memory cells are written to a second predetermined data state (i.e., a selective write operation to the second predetermined data state). The "clear" operation may be performed by writing or programming each memory cell of the given row to a first predetermined data state (in this example embodiment the first predetermined data state is logic "0") using the inventive technique described above.

In particular, transistor of each memory cell 12 of a given row (for example, memory cells 12a-12d) is controlled to store a logic "0". In this regard, stage one and stage two control signals to implement a clear operation as described above are applied to the gate, the source region and the drain region of the transistor of memory cells 12a-12d. In response, the same logic state (for example, logic low or logic "0") is stored in memory cells 12a-12d and the state of memory cells 12a-12d are "cleared".

Thereafter, selected memory cells of the given row may be programmed to the second predetermined logic state. In this regard, the transistors of certain memory cells of a given row are written to the second predetermined logic state in order to store the second predetermined logic state in memory cells. For example, with reference to FIG. 11, memory cells 12b and 12c are programmed to logic high or logic "1" by applying (i) 0.5 v to the gate (via word line $28_i$), (ii) 0 v to the source region (via source line $30_i$), and (iii) 2.5 v to the drain region (via bit line $32_{j+1}$ and $32_{j+2}$), followed by application of −1.0 v to the gate (via word line $28_i$). In particular, such control signals generate or provide an excess of majority carriers in the electrically floating body region of the transistor of memory cells 12b and 12c which corresponds to logic high or logic "1".

As mentioned above, it is preferred that the source current responsible for impact ionization and/or avalanche multiplication in the floating body is initiated or induced by the control signal (control pulse) applied to the gate of the transistor. Such a signal/pulse may induce the channel impact ionization which raises or increases the potential of the electrically floating body region of the transistor of memory cells 12b and 12c and "turns-on" and/or produces a source current in transistor 14. One advantage of the proposed method is that a large amount of the excess majority carriers may be generated and stored in the electrically floating body region of the transistor of memory cells 12b and 12c.

A holding operation or condition may be used for the other memory cells in memory cell array 10 to minimize and/or reduce the impact of the write operation for memory cells 12a-12d connected to word line $28_i$. In one embodiment, a holding signal or voltage is applied to the transistors of other memory cells of memory cell array 10 (for example, each memory cell connected to word lines $28_{i+1}$, $28_{i+2}$, $28_{i+3}$, and $28_{i+4}$). The holding voltages, as described above, are applied to each transistor of the memory cells connected to word lines $28_{i+1}$, $28_{i+2}$, $28_{i+3}$, and $28_{i+4}$. In this way, the impact of the write operation of memory cells 12a-12d (which are connected to word line $28_i$) on the other memory cells of memory cell array 10 is minimized and/or reduced.

Figure 12:
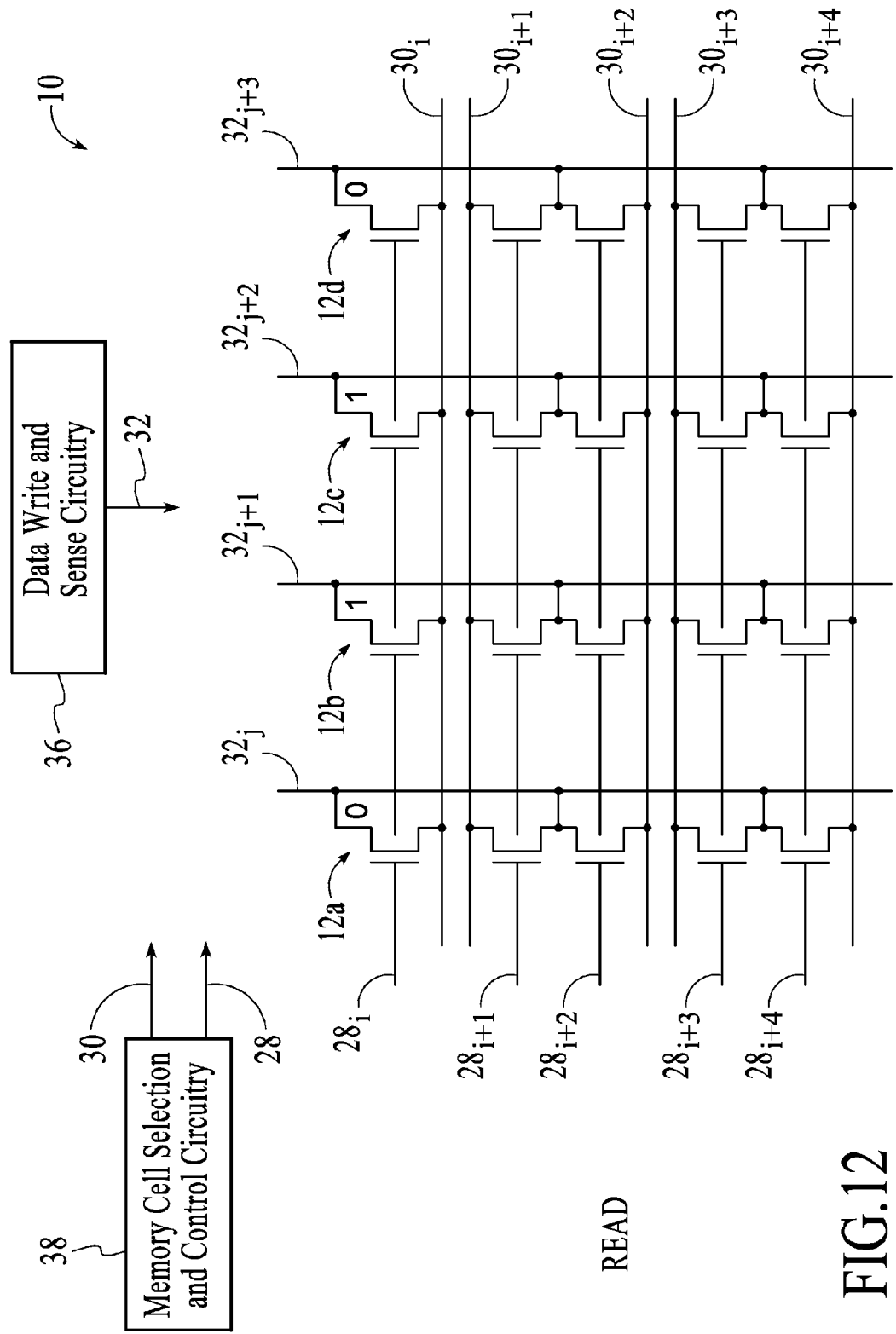

A selected row of memory cells may be read by applying read control signals to the associated word line 28 and associated source lines 30 and sensing a signal (voltage and/or current) on associated bit lines 32. In one example embodiment, with reference to FIG. 12, memory cells 12a-12d are read by applying (i) 0 v to the gate (via word line $28_i$), (ii) 0 v to the source region (via source line 30) and (iii) a voltage approximately in a range of one (1) volt to 2.2 volts to the drain region (via bit line $32_{i+1}$ and $32_{i+2}$). The data write and sense circuitry 36 reads the data state of the memory cells 12a-12d by sensing the response to the applied read control signals. In response to the read control signals, memory cells 12a-12d generate a source current spike or pulse which is representative of the data state of memory cells 12a-12d, as described above. In this example, memory cells 12b and 12c (which were earlier programmed to logic "1"), in response to the read control signals, generate a source current spike which is considerably larger than any channel current. In contrast, in memory cells 12a and 12d (which were earlier programmed to logic "0"), the control signals induce, cause and/or produce little to no source current (for example, a considerable, substantial or sufficiently measurable source current). The sense circuitry 36 senses the data state using primarily and/or based substantially on the source current.

Thus, in response to read control signals, the electrically floating body transistor of each memory cell 12a-12d generates a source current spike which is representative of the data state stored therein. The data sensing circuitry in data write and sense circuitry 36 determines the data state of memory cells 12a-12d based substantially on the source current induced, caused and/or produced in response to the read control signals. Notably, as mentioned above, a read operation may be performed by applying other control signaling techniques.

Again, it may be advantageous to employ a holding operation or condition for the other memory cells in memory cell array 10 to minimize and/or reduce the impact of the read operation of memory cells 12a-12d. With continued reference to FIG. 12, in one embodiment, holding signals or voltages are applied to the transistors of other memory cells of memory cell array 10 (for example, each memory cell connected to word lines $28_{i+1}$, $28_{i+2}$, $28_{i+3}$, and $28_{i+4}$). The holding voltages, as described above, are applied to each transistor of the memory cells connected to word lines $28_{i+1}$, $28_{i+2}$, $28_{i+3}$, and $28_{i+4}$. In this way, the impact of the read operation of memory cells 12a-12d (which are connected to word line $28_i$) on the other memory cells of memory cell array 10 is minimized and/or reduced.

The programming, reading, and holding/refreshing techniques described herein may be used in conjunction with a plurality of memory cells arranged in an array of memory cells. A memory array implementing the structure and techniques of the present inventions may be controlled and configured including a plurality of memory cells having a separate source line for each row of memory cells (a row of memory cells includes a common word line). The memory array may use any of the example programming, reading, and/or holding/refreshing techniques described herein. The memory arrays may comprise N-channel, P-channel and/or both types of transistors. Circuitry that is peripheral to the memory array (for example, sense amplifiers or comparators, row and column address decoders, as well as line drivers (not illustrated herein)) may include P-channel and/or N-channel type transistors. Where P-channel type transistors are employed as memory cells in the memory array(s), suitable write and read voltages (for example, negative voltages) are well known to those skilled in the art in light of this disclosure.

The present inventions may be implemented in any electrically floating body memory cell and memory cell array. For example, in certain aspects, the present inventions are directed to a memory array, having a plurality of memory cells each including an electrically floating body transistor, and/or technique of programming data into and/or reading data from one or more memory cells of such a memory cell array. In this aspect of the inventions, the data states of adjacent memory cells and/or memory cells that share a word line may or may not be individually programmed.

With reference to FIGS. 9A and 9B, memory array 10 may comprise a plurality of memory cells 12 of N-channel type, P-channel type and/or both types of electrically floating body transistors. The memory array 10 includes a plurality of rows and columns (for example, in a matrix form) of memory cells 12.

The circuitry which is peripheral to memory array 10 (for example, data write and sense circuitry 36 (such as, for example, sense amplifiers or comparators), memory cell selection and control circuitry 38 (such as, for example, address decoders and word line drivers)) may include P-channel type and/or N-channel type transistors. Where N-channel type transistors or P-channel type transistors are employed as memory cells 12 in memory array(s) 10, suitable write voltages are known to those skilled in the art.

As mentioned above, memory cells 12 (having electrically floating body transistor 14) and memory cell array 10 of the present inventions may be implemented in an integrated circuit device having a memory portion and a logic portion (see, for example, FIG. 9A), or an integrated circuit device that is primarily a memory device (see, for example, FIG. 9B). Indeed, the present inventions may be implemented in any device having one or more memory cells 12 (having electrically floating body transistors) and/or memory cell arrays 10. For example, with reference to FIG. 9A, an integrated circuit device may include array 10, having a plurality of memory cells 12 (having electrically floating body transistors), data write and sense circuitry, and memory cell selection and control circuitry (not illustrated in detail). The data write and sense circuitry writes data into and senses the data state of one or more memory cells. The memory cell selection and control circuitry selects and/or enables one or more predetermined memory cells 12 to be read by data sense circuitry during a read operation.

For example, the electrically floating body transistor, when programmed (written to), read, held/refreshed, and/or controlled using the techniques of the present inventions, may be employed in any electrically floating body memory cell, and/or memory cell array architecture, layout, structure and/or configuration employing such electrically floating body memory cells. In this regard, an electrically floating body transistor, which state is held using the techniques of the present inventions, may be implemented in the memory cell, architecture, layout, structure and/or configuration described and illustrated in the following non-provisional U.S. patent applications:

(1) Application Ser. No. 10/450,238, which was filed by Fazan et al. on Jun. 10, 2003 and entitled "Semiconductor Device" (now U.S. Pat. No. 6,969,662);
(2) Application Ser. No. 10/487,157, which was filed by Fazan et al. on Feb. 18, 2004 and entitled "Semiconductor Device" (U.S. Patent Application Publication No. 2004/0238890);
(3) Application Ser. No. 10/829,877, which was filed by Ferrant et al. on Apr. 22, 2004 and entitled "Semiconductor Memory Cell, Array, Architecture and Device, and Method of Operating Same" (U.S. Patent Application Publication No. 2005/0013163);
(4) Application Ser. No. 10/840,009, which was filed by Ferrant et al. on May 6, 2004 and entitled "Semiconductor Memory Device and Method of Operating Same" (U.S. Patent Application Publication No. 2004/0228168); and
(5) Application Ser. No. 10/941,692, which was filed by Fazan et al. on Sep. 15, 2004 and entitled "Low Power Programming Technique for a One Transistor SOI Memory Device & Asymmetrical Electrically Floating Body Memory Device, and Method of Manufacturing Same" (U.S. Patent Application Publication No. 2005/0063224).

Notably, the memory cells may be controlled (for example, programmed, read, held/refreshed) using any of the control circuitry described and illustrated in the above-referenced five (5) U.S. patent applications. For the sake of brevity, those discussions will not be repeated; such control circuitry is incorporated herein by reference. Indeed, all memory cell selection and control circuitry for programming, reading, holding/refreshing, controlling and/or operating memory cells including electrically floating body transistors, whether now known or later developed, are intended to fall within the scope of the present inventions.

Moreover, the data write and data sense circuitry may include a sense amplifier (not illustrated in detail herein) to read the data stored in memory cells 12. The sense amplifier may sense the data state stored in memory cell 12 using voltage or current sensing circuitry and/or techniques. In the context of a current sense amplifier, the current sense amplifier may compare the cell current to a reference current, for example, the current of a reference cell (not illustrated). From that comparison, it may be determined whether memory cell 12 contained logic high (relatively more majority carriers 34 contained within body region 18) or logic low data state (relatively less majority carriers 34 contained within body region 18). Such circuitry and configurations thereof are well known in the art.

In addition, the present inventions may employ the reference generation techniques (used in conjunction with the data sense circuitry for the read operation) described and illustrated in U.S. Provisional Patent Application Ser. No. 60/718,417, which was filed by Bauser on Sep. 19, 2005, and entitled "Method and Circuitry to Generate a Reference Current for Reading a Memory Cell Having an Electrically Floating Body Transistor, and Device Implementing Same". The entire contents of the U.S. Provisional Patent Application Ser. No. 60/718,417 are incorporated herein by reference. Further, the present inventions may also employ the read circuitry and techniques described and illustrated in U.S. patent application Ser. No. 10/840,902, which was filed by Portmann et al. on May 7, 2004, and entitled "Reference Current Generator, and Method of Programming, Adjusting and/or Operating Same" (now U.S. Pat. No. 6,912,150). The contents of U.S. Provisional Patent Application Ser. No. 60/718,417 and U.S. Pat. No. 6,912,150 are hereby incorporated by reference herein.

It should be further noted that while each memory cell 12 in the example embodiments (described above) includes one transistor 14, memory cell 12 may include two transistors, as described and illustrated in application Ser. No. 10/829,877, which was filed by Ferrant et al. on Apr. 22, 2004 and entitled "Semiconductor Memory Cell, Array, Architecture and Device, and Method of Operating Same" (U.S. Patent Application Publication No. 2005/0013163). The contents of U.S. Patent Application Publication No. 2005/0013163 are hereby incorporated by reference herein The electrically floating memory cells, transistors and/or memory array(s) may be fabricated using well known techniques and/or materials. Indeed, any fabrication technique and/or material, whether now known or later developed, may be employed to fabricate the electrically floating memory cells, transistors and/or memory array(s). For example, the present inventions may employ silicon, germanium, silicon/germanium, gallium arsenide or any other semiconductor material (whether bulk-type or SOI) in which transistors may be formed. As such, the electrically floating memory cells may be disposed on or in (collectively "on") SOI-type substrate or a bulk-type substrate.

Indeed, the electrically floating transistors, memory cells, and/or memory array(s) may employ the techniques described and illustrated in non-provisional patent application entitled "Integrated Circuit Device, and Method of Fabricating Same", which was filed on Jul. 2, 2004, by Fazan, Ser. No. 10/884,481 (U.S. Patent Application Publication No. 2005/0017240), provisional patent application entitled "One Transistor Memory Cell having Mechanically Strained Electrically Floating Body Region, and Method of Operating Same", which was filed on Oct. 19, 2005, Ser. No. 60/728,060, by Bassin, and/or provisional patent application entitled "Memory Cell, Array and Device, and Method of Operating Same", which was filed on Oct. 19, 2005, Ser. No. 60/728,061, by Okhonin et al. (hereinafter collectively "Integrated Circuit Device Patent Applications"). The contents of the Integrated Circuit Device Patent Applications are hereby incorporated by reference herein.

Memory array 10 (including SOI memory transistors) further may be integrated with SOI logic transistors, as described and illustrated in the Integrated Circuit Device Patent Applications. For example, in one embodiment, an integrated circuit device includes memory section (having, for example, partially depleted (PD) or fully depleted (FD) SOI memory transistors 14) and logic section (having, for example, high performance transistors, multiple gate transistors, and/or non-high performance transistors (for example, single gate transistors that do not possess the performance characteristics of high performance transistors).

Further, memory array(s) 10 may comprise N-channel, P-channel and/or both types of transistors, as well as partially depleted and/or fully depleted type transistors. For example, circuitry that is peripheral to the memory array (for example, sense amplifiers or comparators, row and column address decoders, as well as line drivers (not illustrated herein)) may include FD-type transistors (whether P-channel and/or N-channel type). Alternatively, such circuitry may include PD-type transistors (whether P-channel and/or N-channel type). There are many techniques to integrate both PD and/or FD-type transistors on the same substrate (see, for example, application Ser. No. 10/487,157, which was filed by Fazan et al. on Feb. 18, 2004 and entitled "Semiconductor Device" (U.S. Patent Application Publication No. 2004/0238890)). All such techniques, whether now known or later developed, are intended to fall within the scope of the present inventions. Where P-channel type transistors are employed as memory cells 12 in the memory array(s), suitable write and read voltages (for example, negative voltages) are well known to those skilled in the art in light of this disclosure.

Notably, electrically floating body transistor 14 may be a symmetrical or non-symmetrical device. Where transistor 14 is symmetrical, the source and drain regions are essentially interchangeable. However, where transistor 14 is a non-symmetrical device, the source or drain regions of transistor 14 have different electrical, physical, doping concentration and/or doping profile characteristics. As such, the source or drain regions of a non-symmetrical device are typically not interchangeable. This notwithstanding, the drain region of the electrically floating N-channel transistor of the memory cell (whether the source and drain regions are interchangeable or not) is that region of the transistor that is connected to the bit line/sense amplifier.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions.

As mentioned above, the illustrated/example voltage levels to implement the read and write operations are merely examples. The indicated voltage levels may be relative or absolute. Alternatively, the voltages indicated may be relative in that each voltage level, for example, may be increased or decreased by a given voltage amount (for example, each voltage may be increased or decreased by 0.1, 0.15, 0.25, 0.5, 1 volt) whether one or more of the voltages (for example, the source, drain or gate voltages) become or are positive and negative.

The illustrated/example voltage levels and timing to implement the write and read operations are merely examples. In this regard, in certain embodiments, the control signals increase the potential of electrically floating body region of the transistor of the memory cell which "turns on" or produces a source current in the transistor. In the context of a write or hold operation, the source current generates majority carriers in the electrically floating body region which are then stored. In the context of a read operation, the data state may be determined primarily by, sensed substantially using and/or based substantially on the source current that is responsive to the read control signals and significantly less by the interface channel current component, which is less significant and/or negligible relatively to the bipolar component.

Aspects of the present inventions described herein, and/or embodiments thereof, may include an integrated circuit (IC) device. The IC device of an embodiment comprises a memory cell including a transistor. The transistor of an embodiment includes a gate, a body region configured to be electrically floating, and a source region and a drain region adjacent the body region. The IC device of an embodiment comprises hold circuitry coupled to the memory cell. The hold circuitry of an embodiment is configured to continually apply a set of hold signals to the transistor except during read operations and write operations. The set of hold signals continually hold a data state of the transistor by inherently refreshing the data state. The data state includes a logic high data state and a logic low data state.

The transistor of an embodiment retains the data state as long as the hold signals are applied.

The source region, the body region, and the drain region of the transistor of an embodiment function as the emitter, the base, and the collector of an inherent bipolar transistor, respectively.

When the body region of the transistor of an embodiment is in the logic high data state, the set of hold signals cause bipolar current to flow in the body region. When the body region of the transistor of an embodiment is in the logic low data state, the set of hold signals fail to cause bipolar current to flow in the body region.

The set of hold signals of an embodiment include a first potential applied to the gate, and a second potential applied between the source region and the drain region. The first potential of an embodiment includes a voltage of approximately −0.7 volts. The second potential of an embodiment includes a voltage approximately in a range of 1.5 volts to 3.2 volts. The second potential of an embodiment includes a voltage of approximately 2.3 volts.

When the body region of the transistor of an embodiment is in the logic high data state, the second potential is greater than a threshold above which bipolar current is generated in the body region and the second potential difference causes bipolar current to flow in the body region resulting from the increase of majority carriers in the body region due to impact ionization. When the body region of the transistor of an embodiment is in the logic low data state, the second potential is less than the threshold, wherein the flow of bipolar current is absent in the body region.

The gate of the transistor of an embodiment is disposed over a first portion of the body region. The source region of the transistor of an embodiment adjoins a second portion of the body region that is adjacent the first portion and separates the source region from the first portion. The drain region of the transistor of an embodiment adjoins a third portion of the body region that is adjacent the first portion and separates the drain region from the first portion.

One or more of the source region and the drain region of the transistor of an embodiment include a doped region shaped so that a farthermost boundary of the doped region is separated from a portion of the body region underlying the gate.

The body region of the transistor of an embodiment includes a first type of semiconductor material and the source region and drain region include a second type of semiconductor material.

The source region of the transistor of an embodiment includes a lightly doped region.

The source region of the transistor of an embodiment includes a highly doped region.

The source region of the transistor of an embodiment includes a lightly doped region and a highly doped region.

The drain region of the transistor of an embodiment includes a lightly doped region.

The drain region of the transistor of an embodiment includes a highly doped region.

The drain region of the transistor of an embodiment includes a lightly doped region and a highly doped region.

Aspects of the present inventions described herein, and/or embodiments thereof, may include an integrated circuit (IC) device. The IC device of an embodiment comprises a memory cell consisting essentially of one transistor. The transistor of an embodiment includes a gate, a body region configured to be electrically floating, and a source region and a drain region adjacent the body region. The IC device of an embodiment comprises hold circuitry coupled to the memory cell. The hold circuitry of an embodiment applies hold voltages to the transistor except during read operations and write operations. The hold voltages of an embodiment inherently refresh both a logic high data state and a logic low data state and holding a data state of the transistor. The hold voltages of an embodiment include a first potential applied to the gate, a second potential applied to the source region, and a third potential applied to the drain region.

The transistor of an embodiment retains the data state as long as the hold voltages are applied.

The body region of the transistor of an embodiment functions as an inherent bipolar transistor.

When the body region of the transistor of an embodiment is in the logic high data state, the hold voltages cause bipolar current to flow in the body region When the body region of the transistor of an embodiment is in the logic low data state, the hold voltages fail to cause bipolar current to flow in the body region.

The hold voltages of an embodiment include a first potential applied to the gate, and a second potential applied between the source region and the drain region. The first potential of an embodiment includes a voltage of approximately −0.7 volts. The second potential of an embodiment includes a voltage approximately in a range of 1.5 volts to 3.2 volts. The second potential of an embodiment includes a voltage of approximately 2.3 volts.

When the body region of the transistor of an embodiment is in the logic high data state, the second potential is greater than a threshold above which bipolar current is generated in the body region and the second potential difference causes bipolar current to flow in the body region as a result of impact ionization due to the presence of minority carriers in the body region. When the body region of the transistor of an embodiment is in the logic low data state, the second potential is less than the threshold, wherein the flow of bipolar current is absent in the body region.

Aspects of the present inventions described herein, and/or embodiments thereof, may include an integrated circuit (IC) device. The IC device of an embodiment comprises a memory cell including a transistor. The transistor of an embodiment includes a gate, a body region configured to be electrically floating, and a source region and a drain region adjacent the body region. The IC device of an embodiment comprises hold circuitry coupled to the memory cell. The hold circuitry of an embodiment applies a holding potential to the transistor except during read operations and write operations. The holding potential of an embodiment holds a data state of the transistor written during a preceding write operation causing the transistor to retain the data state as the holding potential is applied. The same holding potential of an embodiment inherently refreshes both a logic high data state and a logic low data state.

The transistor of an embodiment retains the data state as long as the holding potential is applied.

When the body region of the transistor of an embodiment is in the logic high data state, the holding potential causes bipolar current to flow in the body region.

When the body region of the transistor of an embodiment is in the logic low data state, the holding potential prevents bipolar current flow in the body region.

The holding potential of an embodiment includes a first potential applied to the gate, and a second potential applied between the source region and the drain region. The first potential of an embodiment includes a voltage of approximately −0.7 volts. The second potential of an embodiment includes a voltage approximately in a range of 2.2 volts to 2.6 volts.

When the body region of the transistor of an embodiment is in the logic high data state, the second potential is greater than a threshold above which bipolar current is generated in the body region and the second potential difference causes bipolar current to flow in the body region resulting from the increase of majority carriers in the body region due to impact ionization. When the body region of the transistor of an embodiment is in the logic low data state, the second potential is less than the threshold and prevents the flow of bipolar current.

Aspects of the present inventions described herein, and/or embodiments thereof, may include a method for continually holding a data state of a memory cell. The memory cell of an embodiment consists essentially of a transistor configured to include a floating body. The method of an embodiment comprises continually applying a set of hold signals to the memory cell except during read operations and write operations. The set of hold signals of an embodiment hold a data state of the memory cell by inherently refreshing the data state. The data state of an embodiment includes a logic high data state and a logic low data state.

The hold signals of an embodiment cause the transistor to retain the data state as long as the hold signals are applied.

The body region of the transistor of an embodiment functions as an inherent bipolar transistor.

When the floating body of the transistor of an embodiment is in the logic high data state, the set of hold signals cause bipolar current to flow in the floating body. When the floating body of the transistor of an embodiment is in the logic low data state, the set of hold signals fail to cause bipolar current to flow in the floating body.

Applying the set of hold signals of an embodiment comprises applying a first potential to a gate of the transistor and applying a second potential between a source region and a drain region of the transistor. The first potential of an embodiment includes a voltage of approximately −0.7 volts. The second potential of an embodiment includes a voltage approximately in a range of 2.2 volts to 2.6 volts. The second potential of an embodiment includes a voltage of approximately 2.3 volts.

When the floating body of the transistor of an embodiment is in the logic high data state, the second potential is greater than a threshold above which bipolar current is generated in the floating body and the second potential difference causes bipolar current to flow in the floating body resulting from the increase of majority carriers in the floating body due to impact ionization. When the floating body of the transistor of an embodiment is in the logic low data state, the second potential is less than the threshold, wherein the flow of bipolar current is absent in the floating body.

Aspects of the present inventions described herein, and/or embodiments thereof, may include a method for continually holding a data state of a memory cell. The memory cell of an embodiment consists essentially of a transistor configured to include a floating body. The method of an embodiment comprises continually applying a first potential to a gate of the memory cell except during read operations and write operations. The method of an embodiment comprises continually applying a second potential across a source region and a drain region of the memory cell except during read operations and write operations. The first potential and the second potential of an embodiment continually hold a data state previously written to the memory cell by inherently refreshing the data state, the data state including a logic high data state and a logic low data state.

When the floating body of a transistor of an embodiment is in the logic high data state, the first and second potential cause bipolar current to flow in the floating body When the floating body of the transistor of an embodiment is in the logic low data state, the first and second potential prevent bipolar current flow in the floating body.

The first potential of an embodiment includes a voltage of approximately −0.7 volts.

The second potential of an embodiment includes a voltage approximately in a range of 2.2 volts to 2.6 volts.

Aspects of the present inventions described herein, and/or embodiments thereof, may include a method for continually holding a data state of a memory cell. The memory cell of an embodiment consists essentially of a transistor configured to include a floating body. The method of an embodiment comprises continually applying a holding potential to the memory cell during all clock cycles except read cycles and write cycles. The holding potential of an embodiment continually holds a data state of the memory cell written during a preceding write operation causing the memory cell to retain the data state as long as the holding potential is applied. The same holding potential of an embodiment inherently refreshes both a logic high data state and a logic low data state.

Aspects of the present inventions described herein, and/or embodiments thereof, may include an integrated circuit (IC) device. The IC device of an embodiment comprises a memory cell consisting essentially of one transistor. The transistor of an embodiment includes a gate, an electrically floating body region, and a source region and a drain region adjacent the body region. The IC device of an embodiment comprises hold circuitry coupled to the memory cell. The hold circuitry of an embodiment continually applies a holding potential to the transistor except during read operations and write operations. The holding potential of an embodiment holds a data state of the transistor written during a preceding write operation and causes the transistor to retain the data state as long as the holding potential is applied. The same holding potential of an embodiment inherently refreshes a plurality of data states.

The memory cell of an embodiment retains the data state as long as the holding potential is applied.

The body region of the transistor of an embodiment functions as an inherent bipolar transistor.

When the body region of the transistor of an embodiment is in a logic high data state, the holding potential causes bipolar current to flow in the body region When the body region of the transistor of an embodiment is in a logic low data state, the holding potential prevents bipolar current from flowing in the body region.

The holding potential of an embodiment includes a first potential applied to the gate and a second potential applied between the source region and the drain region. The first potential of an embodiment includes a voltage of approximately −0.7 volts. The second potential of an embodiment includes a voltage approximately in a range of 2.2 volts to 2.6 volts. The second potential of an embodiment includes a voltage of approximately 2.3 volts.

When the body region of the transistor of an embodiment is in a logic high data state, the second potential is greater than a threshold above which bipolar current is generated in the body region and the second potential difference causes bipolar current to flow in the body region resulting from the increase of minority carriers in the body region due to impact ionization. When the body region of the transistor of an embodiment is in a logic low data state, the second potential is less than the threshold, wherein the flow of bipolar current is absent in the body region.

Aspects of the present inventions described herein, and/or embodiments thereof, may include an integrated circuit (IC) device. The IC device of an embodiment comprises a memory cell array including a plurality of word lines, a plurality of source lines, a plurality of bit lines, and a plurality of memory cells arranged in a matrix of rows and columns. Each memory cell of an embodiment includes a transistor comprising a body region configured to be electrically floating, a gate disposed over a first portion of the body region and coupled to an associated word line, a source region coupled to an associated source line, and a drain region coupled to an associated bit line. Each memory cell of an embodiment includes a data state. The data state of an embodiment includes a first data state representative of a first charge in the first portion of the body region, and a second data state representative of a second charge in the first portion of the body region. Hold circuitry is coupled to the memory cell array of an embodiment. The hold circuitry continually applies a set of hold signals to the plurality of memory cells except for memory cells undergoing read operations and write operations. The set of hold signals of an embodiment continually hold the data state of each of the plurality of memory cells by inherently refreshing the data state.

The integrated circuit device of an embodiment includes data write circuitry coupled to the memory cell array.

The data write circuitry of an embodiment is coupled to a first set of memory cells of the plurality of memory cells. The data write circuitry of an embodiment is configured to apply first write control signals to the first set of memory cells during a write operation. The hold circuitry of an embodiment applies the set of hold signals to a second set of memory cells of the plurality of memory cells during the write operation. The second set of memory cells of an embodiment includes the plurality of memory cells exclusive of the first set of memory cells.

The integrated circuit device of an embodiment includes data sense circuitry coupled to the memory cell array and configured to sense the data state of the memory cells during a read operation. In response to read control signals applied to a third set of memory cells of an embodiment, the transistor of a memory cell generates a source current which is representative of the data state of the memory cell. The data sense circuitry of an embodiment determines the data state of the memory cell at least substantially based on the source current.

The hold circuitry of an embodiment applies the set of hold signals to a fourth set of memory cells of the plurality of memory cells during the write operation. The fourth set of memory cells of an embodiment includes the plurality of memory cells exclusive of the third set of memory cells.

Each memory cell of the memory cell array of an embodiment retains the data state as long as the set of hold signals is applied.

When the body region of each transistor of an embodiment is in the first data state, the holding potential causes bipolar current to flow in the body region as a result of impact ionization. When the body region of each transistor of an embodiment is in the second data state, the holding potential prevents bipolar current from flowing in the body region.

The set of hold signals of an embodiment includes a first potential applied to the gate and a second potential applied between the source region and the drain region of the transistor of at least one memory cell. The first potential of an embodiment includes a voltage of approximately −0.7 volts. The second potential of an embodiment includes a voltage approximately in a range of 1.8 volts to 3.2 volts. The second potential of an embodiment includes a voltage of approximately 2.3 volts.

As mentioned above, each of the aspects of the present inventions, and/or embodiments thereof, may be employed alone or in combination with one or more of such aspects and/or embodiments. For the sake of brevity, those permutations and combinations will not be discussed separately herein. As such, the present inventions are neither limited to any single aspect (nor embodiment thereof), nor to any combinations and/or permutations of such aspects and/or embodiments.

Moreover, the above embodiments of the present inventions are merely example embodiments. They are not intended to be exhaustive or to limit the inventions to the precise forms, techniques, materials and/or configurations disclosed. Many modifications and variations are possible in light of the above teaching. It is to be understood that other embodiments may be utilized and operational changes may be made without departing from the scope of the present inventions. As such, the foregoing description of the example embodiments of the inventions has been presented for the purposes of illustration and description. Many modifications and variations are possible in light of the above teaching. It is intended that the scope of the inventions not be limited solely to the description above.

The invention claimed is:

1. An integrated circuit device comprising:
   a memory cell comprising a transistor, the transistor comprising a gate, a body region configured to be electrically floating, and a source region and a drain region adjacent the body region; and
   hold circuitry coupled to the memory cell, the hold circuitry to apply a set of hold signals to the transistor except during read operations and write operations, wherein the set of hold signals hold a data state of the transistor by refreshing the data state, wherein the data state comprises a logic high data state and a logic low data state, wherein the set of hold signals cause bipolar current to flow in the body region when the body region is in the logic high data state.

2. The integrated circuit device of claim 1, wherein the transistor retains the data state as long as the hold signals are applied.

3. The integrated circuit device of claim 1, wherein the source region, the body region, and the drain region function as the emitter, the base, and the collector of a bipolar transistor, respectively.

4. The integrated circuit device of claim 1, wherein
   the set of hold signals fail to cause bipolar current to flow in the body region when the body region is in the logic low data state.

5. The integrated circuit device of claim 1, wherein the set of hold signals comprises a first potential applied to the gate, and a second potential applied between the source region and the drain region.

6. The integrated circuit device of claim 5, wherein the first potential comprises a voltage of approximately −0.7 volts.

7. The integrated circuit device of claim 5, wherein the second potential comprises a voltage approximately in a range of 1.5 volts to 3.2 volts.

8. The integrated circuit device of claim 5, wherein the second potential comprises a voltage of approximately 2.3 volts.

9. The integrated circuit device of claim 5, wherein:
   when the body region of the transistor is in the logic high data state, the second potential is greater than a threshold above which bipolar current is generated in the body region and the second potential difference causes bipolar current to flow in the body region resulting from an increase of majority carriers in the body region due to impact ionization; and
   when the body region of the transistor is in the logic low data state, the second potential is less than the threshold, wherein the flow of bipolar current is absent in the body region.

10. The integrated circuit device of claim 1, wherein the gate is disposed over a first portion of the body region.

11. The integrated circuit device of claim 10, wherein the source region adjoins a second portion of the body region that is adjacent the first portion and separates the source region from the first portion.

12. The integrated circuit device of claim 11, wherein the drain region adjoins a third portion of the body region that is adjacent the first portion and separates the drain region from the first portion.

13. The integrated circuit device of claim 1, wherein one or more of the source region and the drain region comprise a doped region shaped so that a boundary of the doped region is separated from a portion of the body region underlying the gate.

14. The integrated circuit device of claim 1, wherein the body region comprises a first type of semiconductor material and the source region and drain region comprise a second type of semiconductor material.

15. The integrated circuit device of claim 14, wherein the source region comprises a lightly doped region.

16. The integrated circuit device of claim 14, wherein the source region comprises a highly doped region.

17. The integrated circuit device of claim 14, wherein the source region comprises a lightly doped region and a highly doped region.

18. The integrated circuit device of claim 14, wherein the drain region comprises a lightly doped region.

19. The integrated circuit device of claim 14, wherein the drain region comprises a highly doped region.

20. The integrated circuit device of claim 14, wherein the drain region comprises a lightly doped region and a highly doped region.

* * * * *